(12) United States Patent
Churak

(10) Patent No.: US 11,064,621 B1
(45) Date of Patent: *Jul. 13, 2021

(54) SECURITY COVERS FOR AUDIO/VIDEO RECORDING AND COMMUNICATION DEVICES

(71) Applicant: Amazon Technologies, Inc., Seattle, WA (US)

(72) Inventor: Jeremy Churak, Los Angeles, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/664,929

(22) Filed: Oct. 27, 2019

Related U.S. Application Data

(63) Continuation of application No. 16/283,839, filed on Feb. 25, 2019, now Pat. No. 10,490,041.

(60) Provisional application No. 62/644,077, filed on Mar. 16, 2018.

(51) Int. Cl.
| | |
|---|---|
| *H05K 5/03* | (2006.01) |
| *H05K 5/02* | (2006.01) |
| *G03B 17/56* | (2021.01) |
| *H04N 5/64* | (2006.01) |
| *H04R 1/02* | (2006.01) |

(52) U.S. Cl.
CPC ............ *H05K 5/03* (2013.01); *G03B 17/561* (2013.01); *H04N 5/64* (2013.01); *H04R 1/02* (2013.01); *H05K 5/0221* (2013.01); *H05K 5/0226* (2013.01)

(58) Field of Classification Search
None
See application file for complete search history.

(56) References Cited

U.S. PATENT DOCUMENTS

| | | | |
|---|---|---|---|
| 6,268,882 B1* | 7/2001 | Elberbaum | G08B 13/19619 348/143 |
| 2003/0013503 A1* | 1/2003 | Menard | H04M 1/725 455/569.2 |
| 2003/0059217 A1* | 3/2003 | Baek | B60R 11/04 396/427 |
| 2005/0184867 A1* | 8/2005 | Osann, Jr. | H04L 67/125 340/539.25 |
| 2007/0177751 A1* | 8/2007 | Tanoni | H04R 1/02 381/345 |

(Continued)

*Primary Examiner* — Cynthia Segura
(74) *Attorney, Agent, or Firm* — Greenberg Traurig, LLP

(57) ABSTRACT

A security cover for an audio/video recording and communication device (A/V device) comprises a front wall includes first and second apertures. The first aperture is positioned to expose a camera of the A/V device. The second aperture is positioned to expose a button of the A/V device. The security cover further includes a set of one or more adjoining sidewalls extending from the front wall and being sloped outward from the front wall. The security cover further includes a mounting surface extending about the set of sidewalls, the mounting surface being spaced from the front wall. The security cover further includes a rigid mounting frame having a first surface for abutting a support surface and a second surface, opposite the first surface, for abutting the mounting surface. The front wall, the set of sidewalls, and the rigid mounting frame together form an interior compartment to contain the A/V device.

20 Claims, 12 Drawing Sheets

(56) References Cited

U.S. PATENT DOCUMENTS

| | | | |
|---|---|---|---|
| 2010/0050538 A1* | 3/2010 | Struthers | H02G 3/123 52/27 |
| 2015/0172520 A1 | 6/2015 | Lindman et al. | |
| 2017/0168376 A1* | 6/2017 | Adervall | H04N 5/2252 |
| 2017/0212411 A1* | 7/2017 | Henriques | F16M 13/02 |

* cited by examiner

SECURITY COVERS FOR AUDIO/VIDEO RECORDING AND COMMUNICATION DEVICES

CLAIM OF BENEFIT TO PRIOR APPLICATIONS

This application is a continuation application of U.S. patent application Ser. No. 16/283,839, filed Feb. 25, 2019. U.S. patent application Ser. No. 16/283,839 claims the benefit of U.S. Provisional Patent Application Ser. No. 62/644,077, filed on Mar. 16, 2018. The contents of U.S. patent application Ser. No. 16/283,839 and U.S. Provisional Patent Application 62/644,077 are hereby incorporated by reference.

TECHNICAL FIELD

The present embodiments relate to audio/video (A/V) recording and communication devices, including A/V recording and communication doorbells, security cameras, and floodlight controllers. In particular, embodiments of the present disclosure relate to protecting these devices from tampering and theft.

BACKGROUND

Home security is a concern for many homeowners and renters. Those seeking to protect or monitor their homes often wish to have audio and video monitoring/communication with visitors such as, for example, those visiting an external door or entryway. A/V recording and communication devices, such as doorbells, provide this functionality, and can also aid in crime detection and prevention. For example, audio and/or video captured by an A/V recording and communication device can be uploaded to the cloud and stored on a remote server. Subsequent review of the A/V footage can aid law enforcement in capturing perpetrators of home burglaries and other crimes. Further, the presence of one or more A/V recording and communication devices on the exterior of a home, such as a doorbell unit at an entrance of a home, can act as a powerful deterrent against would-be burglars.

BRIEF DESCRIPTION OF THE DRAWINGS

The various embodiments of the present security covers for A/V recording and communication devices now will be discussed in detail with an emphasis on highlighting the advantageous features. These embodiments depict the novel and non-obvious security covers for A/V recording and communication devices shown in the accompanying drawings, which are for illustrative purposes only. These drawings include the following figures, in which like numerals indicate like parts.

DETAILED DESCRIPTION

Figure 1:
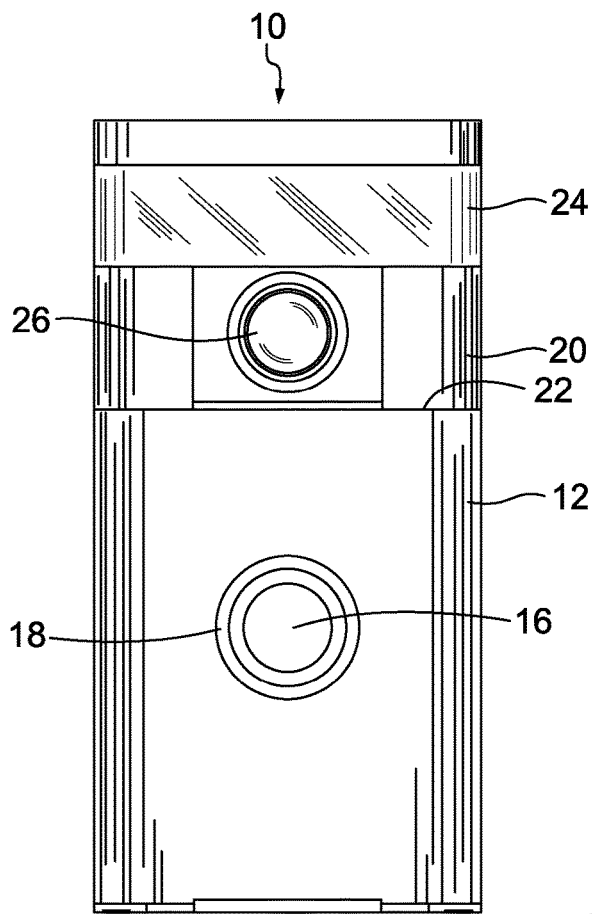
FIG. 1 is a front elevational view of an example A/V recording and communication device that may be enclosed and protected by embodiments of the security cover described in the present disclosure.

At a high level, the subject matter of this disclosure relates to security covers for A/V recording and communication devices that provide protection from theft, tampering, vandalism, and/or other undesirable manipulation. The protection provided by the security covers described herein may increase the likelihood of providing sustained monitoring of people and environments around homes and neighborhoods, thereby increasing the safety of the homes and neighborhoods. The security covers disclosed herein may also protect the enclosed devices from exposure to the elements, potentially reducing wear on the devices and increasing their durability and lifespan, in addition to other benefits.

The use of an A/V recording and communication device on the exterior of a property allows for improved monitoring and awareness of the activity around the property, which improves the safety of people, homes, and neighborhoods. Aspects of the present embodiments include the realization that the sophisticated technical functionality provided by home A/V recording and communication devices, such as doorbells, cameras, and/or floodlight controllers, requires numerous technical components that increase the value of such devices. As a result, the potential for manipulation, including tampering, theft, and/or vandalism, of such devices remains a concern for their owners.

Embodiments of this disclosure and contemplated variations thereof solve this problem by providing, among other things, security covers for A/V recording and communication devices that protect and secure the devices when mounted. Some embodiments of this disclosure provide security covers that are adapted to be mounted to a support surface on which an A/V recording and communication device is also mounted to at least partially enclose the A/V recording and communication device, providing protection and limiting access to the device. A security cover may be configured and/or designed to limit interference with components of the A/V recording and communication device, such as cameras, microphones, sensors, and/or other components, while also supporting the functionality thereof. Further, in some embodiments, the security cover may be sized, shaped, and/or configured to enclose and/or protect an A/V recording and communication device, but also allow a desired amount of accessibility to the device for a user/owner. For example, a security cover may include one or multiple parts that are adjustable between different configurations/positions or that are removable, allowing access to the A/V recording and communication device, such as for maintenance, replacement, or other user-interaction purposes, without completely uninstalling the security cover. The security cover may comprise multiple distinct components that are provided for assembly at a desired location, or may comprise a unified, assembled collection of components useable with an A/V recording and communication device, in different embodiments.

In various embodiments, a security cover may comprise a single unified component, or may comprise a plurality of components/pieces that may be assembled at a desired location. The security cover and components thereof may be formed from any material, including plastic, metal, metal alloy, wood, carbon fiber, and/or other materials or composites, and/or any combination of the same. Further, the security cover may be designed such that it is sized to at least partially enclose a particular A/V recording and communication device, such as a particular doorbell or security monitoring device, so that there is a desired level of tolerance (e.g., flush against surfaces of the device or providing a gap). In some of the present embodiments, the security cover may include one or more openings, exposed areas, and/or movable components that facilitate interaction with and/or functionality of the enclosed A/V recording and communication device and component(s) thereof. This aspect may include, for example, interaction with and/or functionality of a microphone, camera, button, motion sensor, infrared (IR sensor), and/or screen, among other features.

Figure 2:
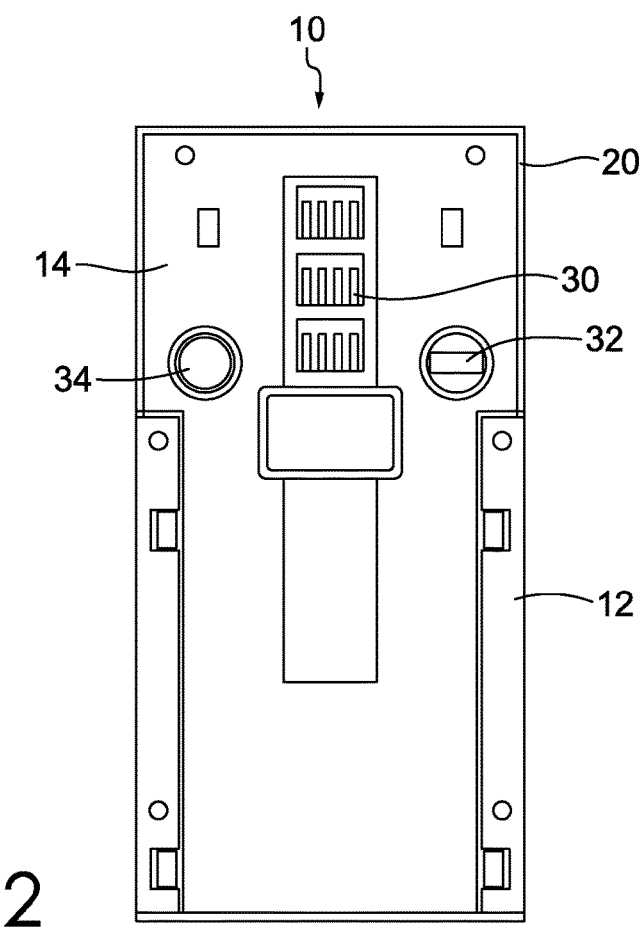
FIG. 2 is a rear elevational view of the A/V recording and communication device shown in FIG. 1.

Turning now to FIGS. 1 and 2, an example A/V recording and communication device that may be enclosed by a security cover in accordance with one or more of the embodiments disclosed herein is provided. The device shown in FIGS. 1-2 is an A/V recording and communication doorbell 10. The doorbell 10 may include a faceplate 12 mounted to a back plate 14 (which is depicted in FIG. 2). The faceplate 12 may be formed from any material including, without limitation, metal, metal alloy, plastic, wood, carbon fiber, composite materials, and/or other types of materials. The faceplate 12 protects the internal components of the doorbell 10 and generally provides an exterior, outward-facing surface of the doorbell 10. The faceplate 12 includes a button 16 and a light pipe 18. The button 16 and the light pipe 18 may comprise different designs, shapes, configurations, and/or placements, which may or may not match the profile of the faceplate 12. The light pipe 18 may comprise any suitable material, including, without limitation, transparent plastic, that is capable of allowing light produced within the doorbell 10 to pass through the light pipe 18. The light may be produced by one or more light-emitting components, such as light-emitting diodes (LEDs), contained within the doorbell 10. The button 16, when depressed, may move into contact with a button actuator (not depicted in FIGS. 1-2) located inside the housing of the doorbell 10. The button 16 may trigger one or more functions of the doorbell 10 when depressed (e.g., ringing the doorbell 10).

With continued reference to FIGS. 1 and 2, the doorbell 10 may include an enclosure 20 that engages the faceplate 12. The enclosure 20 of the doorbell 10 may abut an upper edge 22 of the faceplate 12. In alternative aspects, one or more gaps between the enclosure 20 and the faceplate 12 may facilitate the passage of sound and/or light through the doorbell 10. The enclosure 20 may comprise any material including, without limitation, metal, metal alloy, plastic, composite materials, and/or other types of materials. The enclosure 20 may be transparent, or at least partially transparent, so that infrared light can pass from inside the doorbell 10 to an outside environment and vice versa. The doorbell 10 may further include a lens 24. In some embodiments, the lens 24 may comprise a Fresnel lens, which may be configured to deflect incoming light into one or more infrared sensors located within the doorbell 10. The doorbell 10 may also include a camera 26, which may be configured to capture video data when activated.

With reference to FIG. 2, a rear view of the doorbell 10 is depicted. The enclosure 20 may extend from the front of the doorbell 10 around to the back thereof and may fit snugly around a lip of the back plate 14. The back plate 14 may comprise any suitable material, including, without limitation, metal (e.g., such as brushed aluminum), metal alloys, or plastics, and/or any combination of the same or other materials. The back plate 14 may protect the internal components of the doorbell 10 and may serve as an exterior rear surface of the doorbell 10 that can be mounted to a support surface (e.g., without limitations, a wall, a door frame, a pole, etc.). The faceplate 12 may extend from the front of the doorbell 10 and at least partially wrap around the back plate 14, providing a coupled attachment between the faceplate 12 and the back plate 14. The back plate 14 may have indentations in its structure to facilitate such attachment.

The spring contacts 30 shown in FIG. 2 may provide power to the doorbell 10 when mated with other conductive contacts that are connected to a power source. The spring contacts 30 may comprise any suitable conductive material, including, without limitation, copper or silver, and may be capable of deflecting when depressed, for example, by insertion of a mating element. The doorbell 10 further includes a connector 32, which may be a micro-USB connector or other type of connector, through which power and/or data may be supplied to and obtained from the components of the doorbell 10. The doorbell 10 may include a reset button 34 located on the back plate 14, which may be depressed to contact a button actuator (not depicted in FIGS. 1-2) located within the doorbell 10. When the reset button 34 is depressed, it may trigger one or more functions of the doorbell 10, such as a restart procedure.

FIGS. 1-2 depict one example A/V recording and communication device that, as discussed herein, can be mounted on an exterior of a home or structure to provide video and/or audio monitoring and communication that enhances awareness and safety for homes and neighborhoods. The doorbell 10 of FIGS. 1-2 is only one example of an A/V recording and communication device that embodiments of the security cover disclosed herein may be adapted to enclose and protect, and is provided only for illustrative purposes.

Figure 3A:
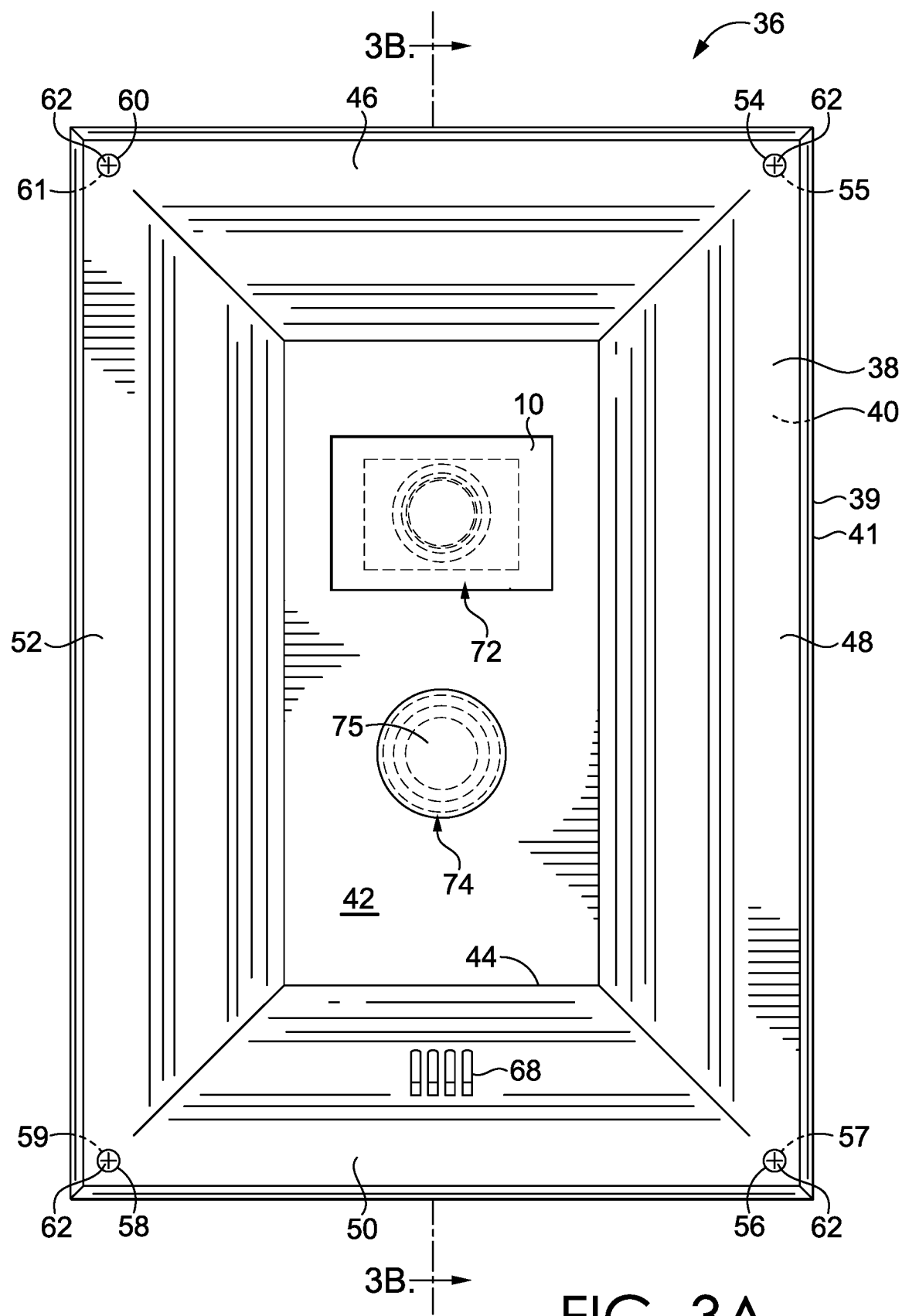
FIGS. 3A-3C are a front elevational view, a side elevational cross-section view, and an exploded perspective view of a security cover for an A/V recording and communication device, according to various aspects of the present disclosure.
Figure 3B:
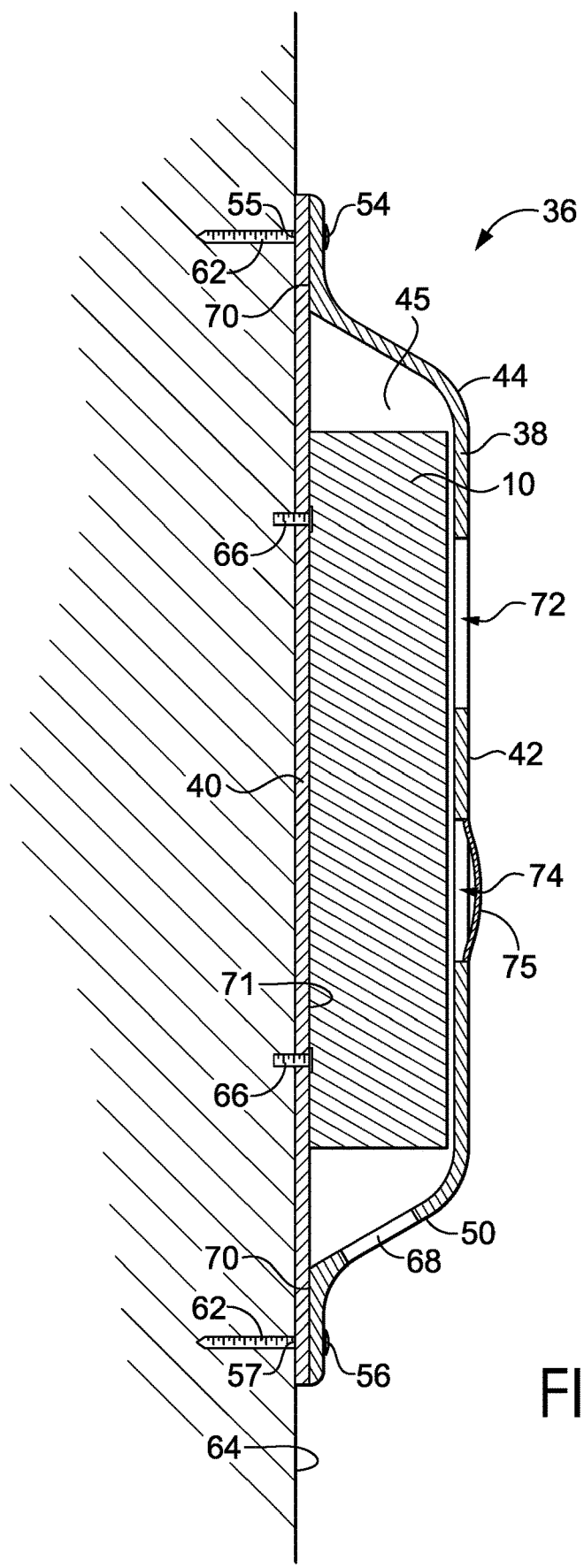
Figure 3C:
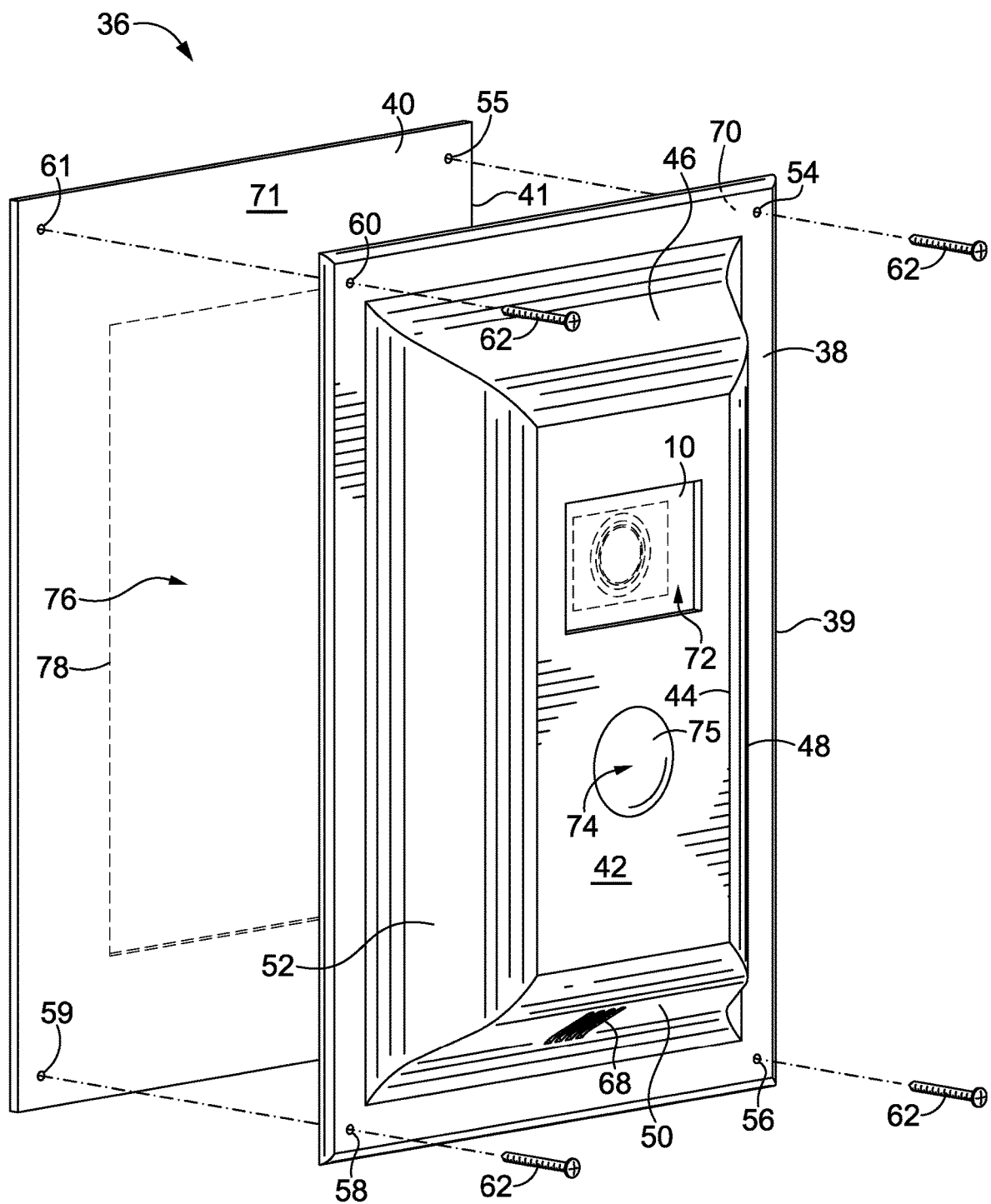

Having described one example A/V recording and communication device, reference is now made to FIGS. 3A-3B, which generally depict a security cover 36 on an A/V recording and communication device according to various aspects of the present disclosure. FIG. 3A depicts a front elevational view of the security cover 36, which in this illustrated example is protecting the doorbell 10 depicted in FIGS. 1-2. The security cover 36 may be sized to be secured over the doorbell 10 to protect the doorbell 10 and reduce unwanted access to or manipulation of the doorbell 10. FIG. 3B depicts a side elevational, cross-section view of the security cover 36 showing the security cover 36 mounted to a support surface 64. FIG. 3C further depicts an exploded, perspective view of the security cover 36 without the doorbell depicted, for clarity.

Referring initially to FIG. 3A, the security cover 36 may include a rigid covering 38 with a perimeter 39 and a rigid mounting plate/frame 40 with a perimeter 41. In the embodiment depicted in FIGS. 3A-3C, the perimeters 39, 41 are collinear, running along each other to provide a similar enclosed area. However, in alternative embodiments, the first perimeter 39 may extend further outward or inward than the perimeter 41 at any point along the collective perimeters 39, 41. For example, in an embodiment, the perimeter 41 may be enclosed within the perimeter 39, with the rigid covering 38 overlapping the perimeter 41 of the rigid mounting plate 40.

With continued reference to FIGS. 3A-3C, the rigid covering 38 may include a front wall 42 defining a front wall perimeter 44. Due to the curved contours and possible gradual transitions between portions of the rigid covering 38, the delineation of the front wall perimeter 44 may not necessarily be clear and may therefore be somewhat blurred. In any case, a relative delineation between adjacent surfaces (e.g., the front wall 42 and a sidewall extending from the front wall 42) may be considered the front wall perimeter in some embodiments (e.g., the sloped portion between the front wall 42 and a sidewall may generally define part of the front wall perimeter 44 in some embodiments).

The rigid covering 38 depicted in FIG. 3A further includes sidewalls 46, 48, 50, 52. Although four generally delineated sidewalls 46, 48, 50, 52 are shown in FIG. 3A, in other embodiments, any number of sidewalls, including one continuous sidewall without clear delineations defining adjacent sidewalls, may be provided. The sidewalls 46, 48, 50, 52 extend from the front wall perimeter 44 and are sloped outward from the front wall 42 to define a relatively enclosed interior compartment 45 (shown more clearly in FIG. 3B) of the security cover 36. In general, a junction between each of the sidewalls 46, 48, 50, 52 and the front wall 42 may be sloped to provide a smoothed contour on an exterior-facing surface of the security cover 36 that reduces leverage for someone trying to grasp or remove the security cover 36 from a support surface 64 on which it is mounted. Further, the front wall 42 may be at least partially flat, planar, and/or convex or concave, and also, each of the sidewalls 46, 48, 50, 52 may be at least partially flat, concave, convex, and/or otherwise contoured to include non-planar surfaces that further reduce leverage for someone trying to grasp or remove the security cover 36 from the support surface 64.

Further depicted in FIG. 3A are fastener apertures 54, 56, 58, 60 extending through the rigid covering 38 and also corresponding fastener apertures 55, 57, 59, 61 extending through the rigid mounting plate 40. As shown in FIGS. 3A-3C, the fastener apertures 54, 56, 58, 60 in the rigid covering 38 and the fastener apertures 55, 57, 59, 61 in the rigid mounting plate 40 are at least partially aligned, forming respective fastener passageways that extend through the rigid covering 38 and the rigid mounting plate 40. Further, elongated fasteners 62, depicted in FIGS. 3B-3C, are provided that may be extended through the fastener passageways for securement to a support surface 64 on which the A/V recording and communication device and the security cover 36 are mounted.

The fasteners 62 may be threaded screws, expansion screws or bolts, or other elongated fasteners, and may be provided with the security cover in some embodiments. In one non-limiting aspect, the fasteners 62 are screws that are each approximately 1-4 centimeters (e.g., at least one inch) in length and approximately 1-3 millimeters in diameter. Other diameters, lengths, and/or sizes of fasteners are also possible. Additionally, as shown in FIG. 3B, the doorbell 10 may include its own fasteners 66 for securing the doorbell 10 to the support surface 64. The fasteners 62 used for securing the security cover 36 to the support surface 64 may, in some embodiments, be sized to have larger dimensions (e.g., diameter, length, thread size, etc.) than the fasteners 66 for the doorbell 10. The fasteners 62 may, in this sense, be selected to provide stronger attachment to the support surface 64 compared to the fasteners 66 used for the doorbell 10. Additionally, a security cover, such as the security cover 36 shown in FIGS. 3A-3C, may include apertures in an associated rigid covering, such as the rigid covering 38 shown in FIGS. 3A-3C, and an associated rigid mounting plate, such as the rigid mounting plate 40 shown in FIGS. 3A-3C, that are sized to compliment a widest diameter of an associated elongated fastener (e.g., for a screw with a diameter of 1.5 millimeters, the associated aperture in the security cover may have the same diameter plus a certain amount of additional diameter based on a desired tolerance (e.g., approximately 0.001-1 millimeter of additional tolerance in diameter)). In other embodiments, a different number of fasteners and fastener passageways may be used with a security cover depending on the desired level of securement to a support surface. Further, in alternative embodiments, other forms of securement may be used instead of fasteners threaded through fastener passageways, such as, for example, adhesive, bolts, male/female connectors, or other securement methods, which are contemplated as within the scope of this disclosure.

FIGS. 3A-3C further depict that the rigid covering 38 may include a plurality of slit apertures (or sound apertures) 68 extending through the rigid covering 38, the slit apertures 68 positioned adjacent each other (e.g., within approximately 1 centimeter of each other). The slit apertures 68 allow for the passage of sound to and from a microphone and/or a speaker of the doorbell 10 enclosed within the security cover 36. In this sense, the slit apertures 68 may be located on the rigid covering 38 such that they are generally adjacent to a speaker and/or a microphone of an enclosed A/V device, facilitating the transmission of sound. In different embodiments, the slit apertures 68 may be positioned at different locations on the rigid covering 38 depending on the location of a microphone and/or speaker on the enclosed A/V recording and communication device. Aspects of the security cover may also include no slit apertures if there is no microphone or speaker on the device. Furthermore, a single aperture rather than multiple adjacent apertures may be provided on a security cover. Additionally, one or more apertures may be provided for each speaker and/or microphone positioned around the doorbell 10. As an example, one or more apertures could be formed in the sidewall 52 for a speaker located proximate to the sidewall 52, and one or more other apertures could be formed in the sidewall 48 for a speaker proximate to the sidewall 48.

The rigid covering 38 of the security cover 36 may further include a mounting surface 70 located at a distal end of the sidewalls 46, 48, 50, 52, the mounting surface 70 extending about the distal edges and also about the first perimeter 39 of the rigid covering 38. The first plurality of fastener apertures 54, 56, 58, 60 extend through the mounting surface 70. The mounting surface 70 may be at least partially planar, so that the planar portion is positionable against a planar surface 71 of the rigid mounting plate 40, providing mated contact of the rigid covering 38 and the rigid mounting plate 40 upon assembly of the security cover 36. The security cover 36 may alternatively be pre-assembled with the rigid covering 38 and rigid mounting plate 40 joined, or otherwise formed as one cohesive piece. Once joined, the rigid covering 38 and rigid mounting plate 40 at least partially enclose the interior compartment 45 of the security cover 36 for covering the doorbell 10. The rigid mounting plate 40, in some of the present embodiments, may be sized to cover the mounting surface 70.

The rigid covering 38 may further include an aperture 72 positioned to at least partially expose a camera of the doorbell 10 (e.g., when the security cover 36 is mounted over the doorbell 10, the aperture 72 may at least partially overlap the enclosure 20 of the doorbell 10 to expose the camera 26). The aperture 72 is depicted as rectangular, but may be any shape, such as circular, oval, square, or polygonal, and may be any size. The aperture 72 may be sized so that the camera 26 (FIG. 1) is not obscured by the rigid covering 38 (e.g., the aperture 72 is sized so that the rigid covering 38 is substantially not in the field of view of the camera). As another example, the rigid covering 38, in some of the present embodiments, may further include one or more apertures (not shown) positioned to at least partially expose a motion sensor, an infrared sensor, and/or any other sensors of the doorbell 10 (e.g., when the security cover 36 is mounted over the doorbell 10, the aperture(s) may at least partially overlap the lens 24 and/or a motion sensor (not shown) of the doorbell 10 to expose the lens 24 and/or the motion sensor).

The rigid covering 38 may be formed from a material, such as plastic, Plexiglas, or another composite, that is at least partially transparent or opaque, such that the doorbell 10, when enclosed, is at least partially visible. In additional embodiments, the rigid covering 38 may be formed from a material that provides a particular tensile strength and/or hardness to withstand a desired amount of forces. As one example, a rigid covering may be formed from High Impact Polystyrene (HIPS), Polycarbonate (PC), Acrylonitrile Butadiene Styrene (ABS), or another material such as carbon fiber, aluminum, steel, Kevlar, or any combination of the aforementioned in order to impart a desired tensile strength and/or hardness.

Further, in some embodiments, the rigid covering 38 may be formed of a transparent material and may extend over the location of the camera aperture or lens, such that pictures and/or video is/are recorded looking through the rigid covering 38. Some of these embodiments (where the rigid covering 38 is formed of a transparent material that extends over the location of the camera aperture or lens), may not include the aperture 72. In some of the present embodiments, the aperture 72 may further have a material coupled to and/or extending across it, covering the camera lens, with such a material being of a higher transparency than the material of the rigid covering 38.

The rigid covering 38 may further include an aperture 74 that is spaced from the aperture 72 by a portion of the front wall 42. The aperture 74 is circular, as an example, and may be sized such that its circumference is equal to or larger than the circumference of the button 16 (FIG. 1) on the doorbell 10 that is accessed through the aperture 74. Generally, the aperture 74 may be configured such that the underlying button 16 may still be triggered (e.g., by a finger) while the security cover 36 is mounted over the doorbell 10. Further, as is most clearly shown in FIG. 3B, the aperture 74 is, in some of the present embodiments, at least partially covered by a flexible membrane 75 (e.g., silicone, rubber, or another flexible material). The flexible membrane 75 is coupled to the front wall 42 of the rigid covering 38 such that it extends across the aperture 74, allowing the flexible membrane 75 to be depressed inward to actuate the button on the doorbell 10. The flexible membrane 75 may provide protection for the device while preserving the functionality of the button 16. Although the aperture 74 of the security cover 36 is depicted as a circle, it may be any shape, and may be positioned at any appropriate location based on the design of the A/V recording and communication device that is to be enclosed by the security cover. In addition, multiple apertures, including those with flexible and/or movable coverings (e.g., a flexible membrane, a movable button or piece, etc.) may be provided on a security cover for actuating various physical components of an enclosed A/V recording and communication device.

FIGS. 3B and 3C depict how the rigid covering 38 and the rigid mounting plate 40 may be coupled to each other so that the fastener apertures 54, 56, 58, 60 of the rigid covering 38 and the fastener apertures 55, 57, 59, 61 of the rigid mounting plate 40 are in alignment, forming fastener passageways for receiving the elongated fasteners 62 that may be used to secure the security cover 36 to the support surface 64. The example security cover 36 shown in FIGS. 3A-3C includes four apertures that are respectively positioned adjacent corners of the security cover 36. In other embodiments, more or fewer fastener passageways, formed at any number of locations on a security cover, may be provided (e.g., four, six, eight, or ten passageways spaced at equal distances around the perimeter of a security cover).

Additionally, in some embodiments, the rigid mounting plate 40, which may be planar, partially planar, curved, partially curved, and/or at least partially concave or convex, may include an interior aperture 76 (delineated for example purposes in dotted lines and marked as interior aperture 76 in FIG. 3C) that essentially provides an opening through the rigid mounting plate 40. The interior aperture 76 shown in FIG. 3C is delineated by an interior aperture perimeter 78. A circumference, and also an enclosed area, of the interior aperture perimeter 78 may be equal to or larger than a circumference, and enclosed area, of an outer contour of an A/V recording and communication device (e.g., the doorbell 10 described herein) mounted to the support surface 64 that is to be enclosed by the security cover 36. In this sense, in this embodiment, there is a sufficient opening for the A/V recording and communication device to make contact with the support surface 64 for mounting it separately from the security cover 36. In alternative embodiments, there may be no interior aperture 76, or a smaller or different interior aperture, and instead the rigid mounting plate 40 may be configured so that the A/V recording and communication device can be mounted directly on the rigid mounting plate 40 instead of or in addition to being attached directly to the support surface 64. For example, the surface 71 of the mounting plate 40 may include adhesive, hook-and-loop fasteners, mounting adaptations (e.g., components that are mateable/attachable with components of an A/V device), or other fasteners or attaching mechanisms. Further, the rigid mounting plate 40 may include apertures for receiving fasteners, such as the fasteners 66 shown in FIG. 2B, used for attaching an A/V device directly to the support surface 64.

Figure 4A:
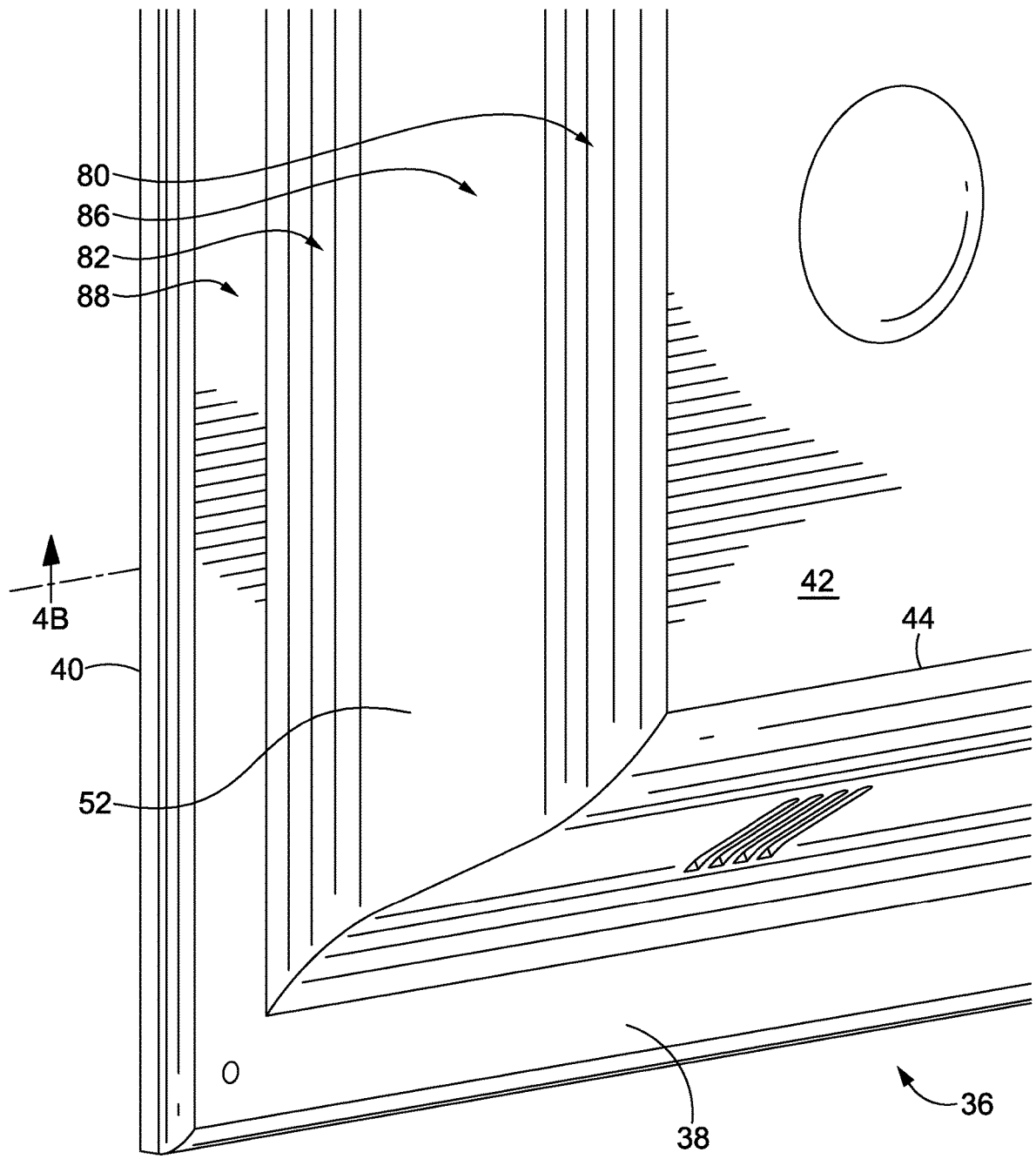
FIGS. 4A-4B are a partial perspective view, and a partial, side elevational, cross-section view of a portion of the security cover depicted in FIGS. 3A-3C, according to various aspects of the present disclosure.

Referring to FIG. 4A, an angled, perspective view of a portion of the rigid covering 38 depicted in FIGS. 3A-3C is shown, according to various aspects of the present disclosure. FIG. 4A illustrates junctions connecting different portions of the rigid covering 38 that provide sloped transitions between the different portions. Although a portion of the rigid covering 38 is depicted in FIG. 4A for illustrative purposes, the junction configurations depicted and described with respect to FIGS. 4A and 4B may exist at different locations on the security cover 36 (e.g., at other sidewalls) and are discussed in isolation for clarity and simplicity only.

FIG. 4A shows how the front wall 42 of the rigid covering 38 extends outward to the front wall perimeter 44 where a junction 80 is located that interconnects the front wall 42 and the sidewall 52 of the rigid covering 38. The sidewall 52 is sloped outward from the front wall 42. The junction 80 is sloped so that it provides a curved contour between the front wall 42 and the sidewall 52 (e.g., at least on the side of the rigid covering 38 that faces outward when the security cover 36 is mounted to the support surface 64). The smooth, curved contour at the junction 80 may help to decrease leverage or grip, making it more difficult for someone to remove or tamper with the security cover 36 to gain access to the enclosed contents of the security cover 36.

In addition to the junction 80 located between the front wall 42 and the sidewall 52, there may be a junction 82 located on the sidewall 52 that is spaced from the junction 80. The junction 82 may have similar or different characteristics as the junction 80 (e.g., slope, curvature, transitional length, thickness, texture, concavity, etc.). The junctions 80, 82 of the sidewall 52 segment the sidewall 52 into different portions. As noted above, for each sidewall of a security cover, the size, shape, slope, curvature, concavity, convexity, and/or other characteristics of the junctions/portions may be the same or different as other sidewalls.

The sidewall 52 shown in FIG. 4A includes a portion 86 that extends from the junction 80 at an angle, forming a sloped contour. The portion 86 may be at least partially planar, curved, sloped, concave, and/or convex, and may have any thickness (e.g., 1-20 millimeters). The portion 86 extends to the junction 82 at which the slope of the rigid covering 38 changes again to transition into a portion 88 of the sidewall 52 that also may be at least partially planar, curved, sloped, concave, and/or convex, like the portion 86. As discussed herein, an outward-facing side of each junction 80, 82 may include a smooth contour which may reduce the ability to grasp the rigid covering 38 and gain access to its enclosed contents (e.g., in the present embodiment, the doorbell 10).

Figure 4B:
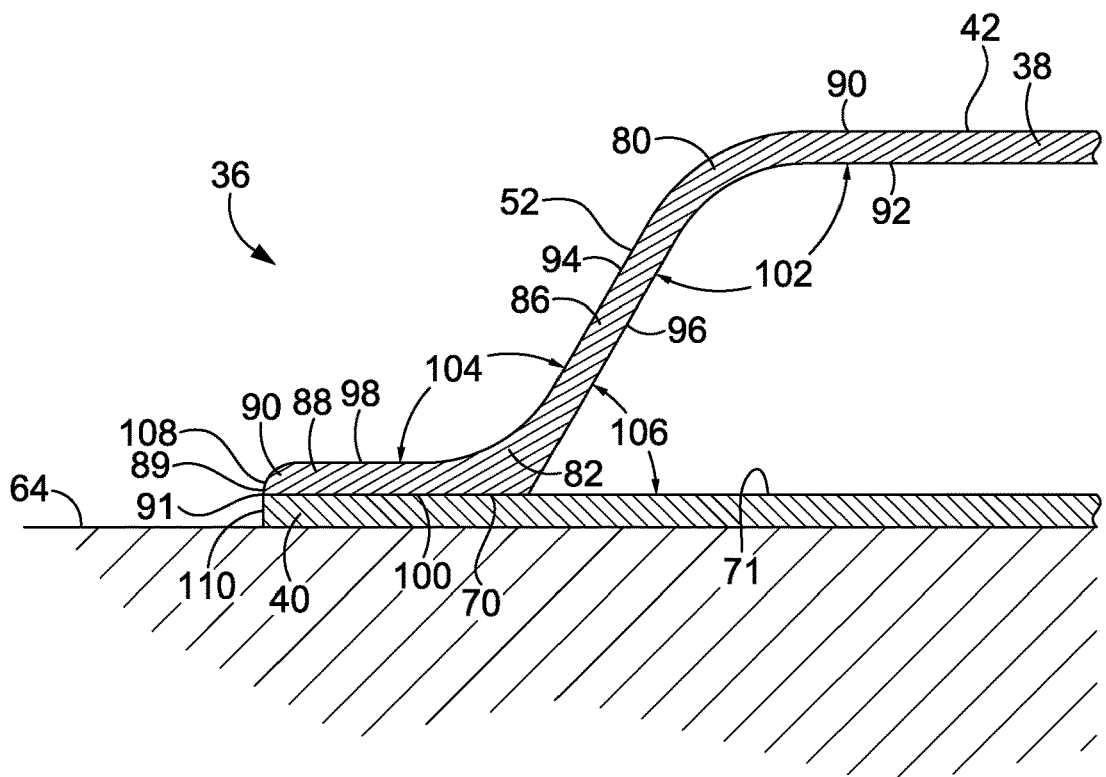

Turning now to FIG. 4B, a partial, cross-section view of the portion of the rigid covering 38 shown in FIG. 4A is depicted, according to various aspects of the present disclosure. In FIG. 4B, a portion of the front wall 42 and a portion of the sidewall 52 are shown illustrating the directional transitions between the front wall 42, the junction 80, the portion 86 of the sidewall 52, the junction 82, the portion 88 of the sidewall 52, and finally a perimeter transition 89 of the sidewall 52. The perimeter transition 89 comprises a curved contour that extends to an outer edge 91 of the planar mounting surface 70. In other embodiments, the perimeter transition 89 may not have a curved contour (e.g., it may be orthogonal). However, a curved contour may be used to further increase the difficulty of grasping the rigid covering 38 to leverage it off of the support surface 64 and/or the rigid mounting plate 40.

Further referencing FIG. 4B, the front wall 42 of the rigid covering 38 includes a front wall first side 90 and an opposite front wall second side 92, which may or may not be parallel, and which may each be at least partially planar, sloped, convex, and/or concave, or any combination of the same. The portion 86 of the sidewall 52 includes a sidewall portion first side 94 and an opposite sidewall portion second side 96, which may or may not be parallel. Moving past the junction 82, the sidewall portion 88 includes a sidewall portion first side 98 and an opposite sidewall portion second side 100, which may or may not be parallel. As discussed above, the other sidewalls 46, 48, and 50 of the rigid covering 38 may include similar junctions, wall portions, surfaces, and angles, or may be at least partially different.

As shown in FIG. 4B, the junction 80 forms an angle 102 between the front wall second side 92 and the sidewall portion second side 96. In embodiments, the angle may range from approximately 90-150 degrees, with it being shown as roughly 130 degrees in the example embodiment depicted in FIG. 4B. Further, the junction 82 forms an angle 104 between the sidewall portion first side 94 and the sidewall portion first side 98. In embodiments, the angle 104 may range from approximately 90-150 degrees, with it being shown as roughly 130 degrees in the example embodiment depicted in FIG. 4B. Other angles, either for curved-transition or sharp-transition junctions, are contemplated herein as well. Further, between the sidewall portion second side 96 and the surface 71 of the rigid mounting plate 40 there is an angle 106. The angle 106, in different embodiments, may be an orthogonal angle, or an acute angle. For example, the angle 106 may be between 10 and 90 degrees, and is depicted as being roughly 45 degrees in the embodiment depicted in FIG. 4B. FIG. 4B further depicts the mounting surface 70, which may be planar or at least partially planar such that it mateably abuts the surface 71 of the rigid mounting plate 40.

Figure 5:
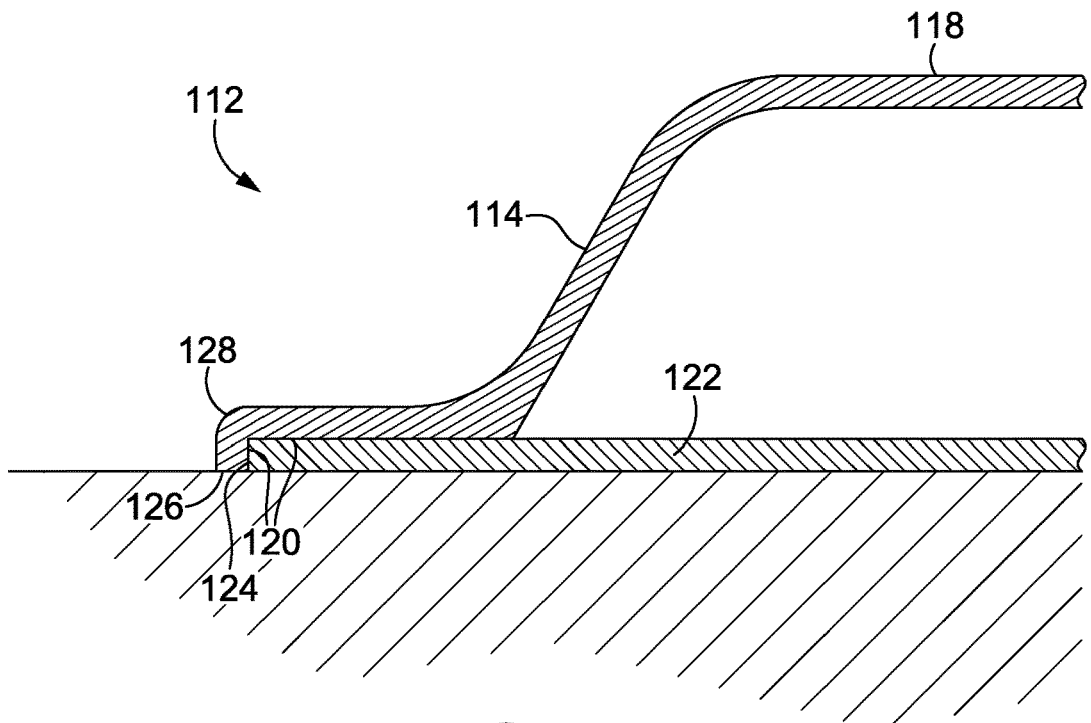
FIG. 5 is a partial, side elevational, cross-section view of an alternative embodiment of a security cover for an A/V recording and communication device, according to various aspects of the present disclosure.

In some embodiments of the security cover, the mounting surface 70 may sit on the rigid mounting plate 40, as shown in FIG. 4B, with a perimeter edge 108 of the sidewalls 46, 48, 50, 52 extending to a perimeter edge 110 of the rigid mounting plate 40. In other embodiments, the mounting surface 70 may extend over the perimeter edge 110 of the rigid mounting plate 40 to at least partially sit on or abut the support surface 64 on which the security cover 36 is mounted (e.g., the sidewalls 46, 48, 50, 52 may curve over the perimeter edge 110 of the rigid mounting plate 40, as shown in FIG. 5). In this sense, the sidewalls 46, 48, 50, 52 may at least partially enclose the perimeter edge 110 of the mounting plate 40 with a curved contour that increases the difficulty of grasping the security cover 36 and gaining leverage. In other words, the perimeter edge 108 of the sidewalls 46, 48, 50, 52 may at least partially enclose the perimeter edge 110 of the mounting plate 40, in some embodiments.

Referring now to FIG. 5, a partial, cross-section view of an alternative configuration of a security cover 112 is depicted. The security cover 112 may be similar to the security cover 36, but with sidewalls 114 that form at least part of a rigid covering 118 that includes a concave portion 120 shaped to mateably receive at least a portion of a rigid mounting plate 122, according to various aspects of the present disclosure. In these embodiments, as discussed above, the sidewalls 114 curve over a perimeter edge 124 of the rigid mounting plate 122 to provide a (e.g., planar) mounting surface 126 that abuts the support surface 64 on which the security cover 112 is mounted. A curved portion 128 covering the perimeter edge 124 of the rigid mounting plate 122 may, once again, provide a sloped, smooth contour that increases the difficulty of grasping and/or leveraging the security cover 112 off of the support surface 64.

Figure 6A:
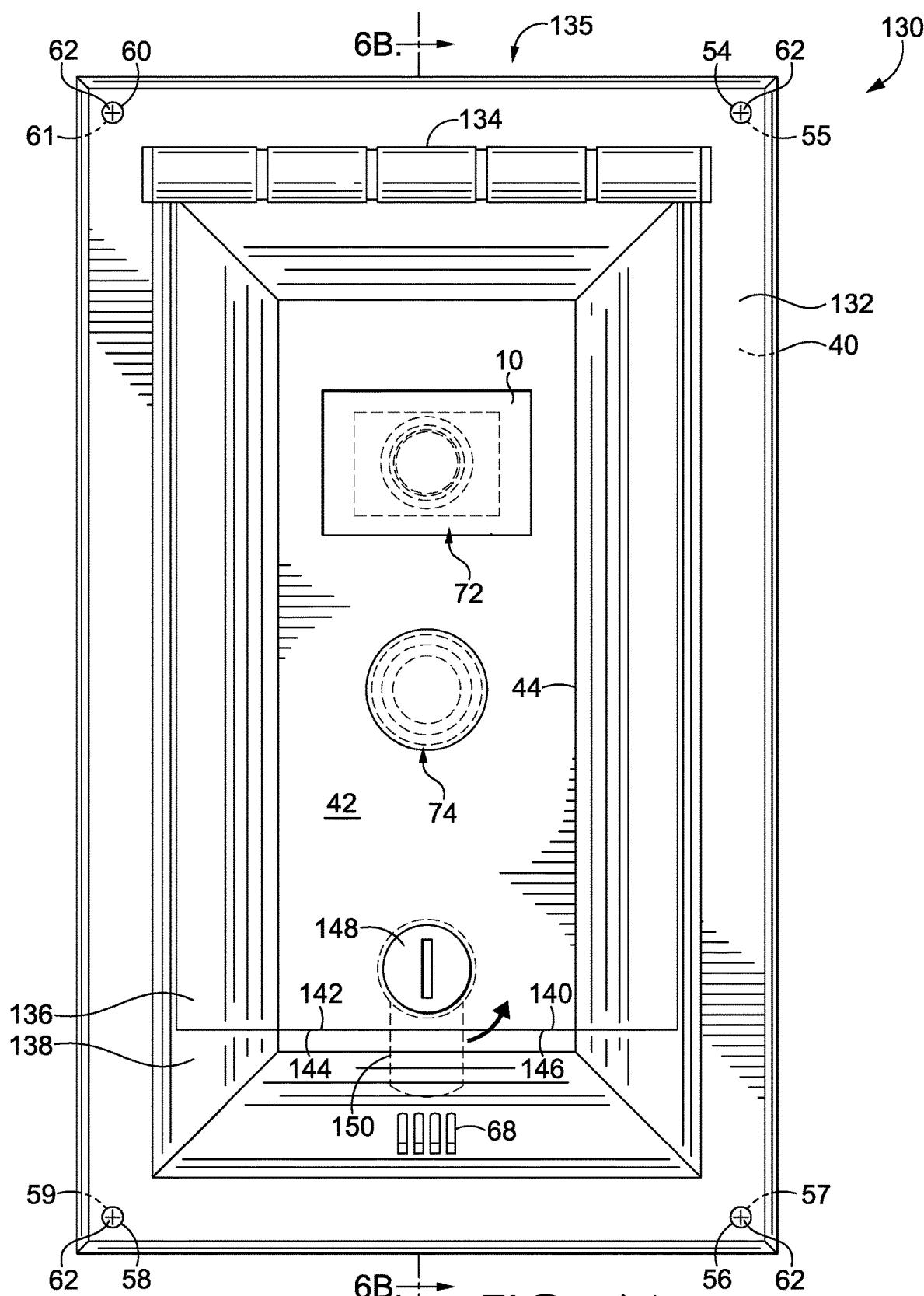
FIGS. 6A-6C are a front elevational view, a side elevational cross-section view, and an exploded perspective view of another embodiment of a security cover for an A/V recording and communication device, according to various aspects of the present disclosure.
Figure 6B:
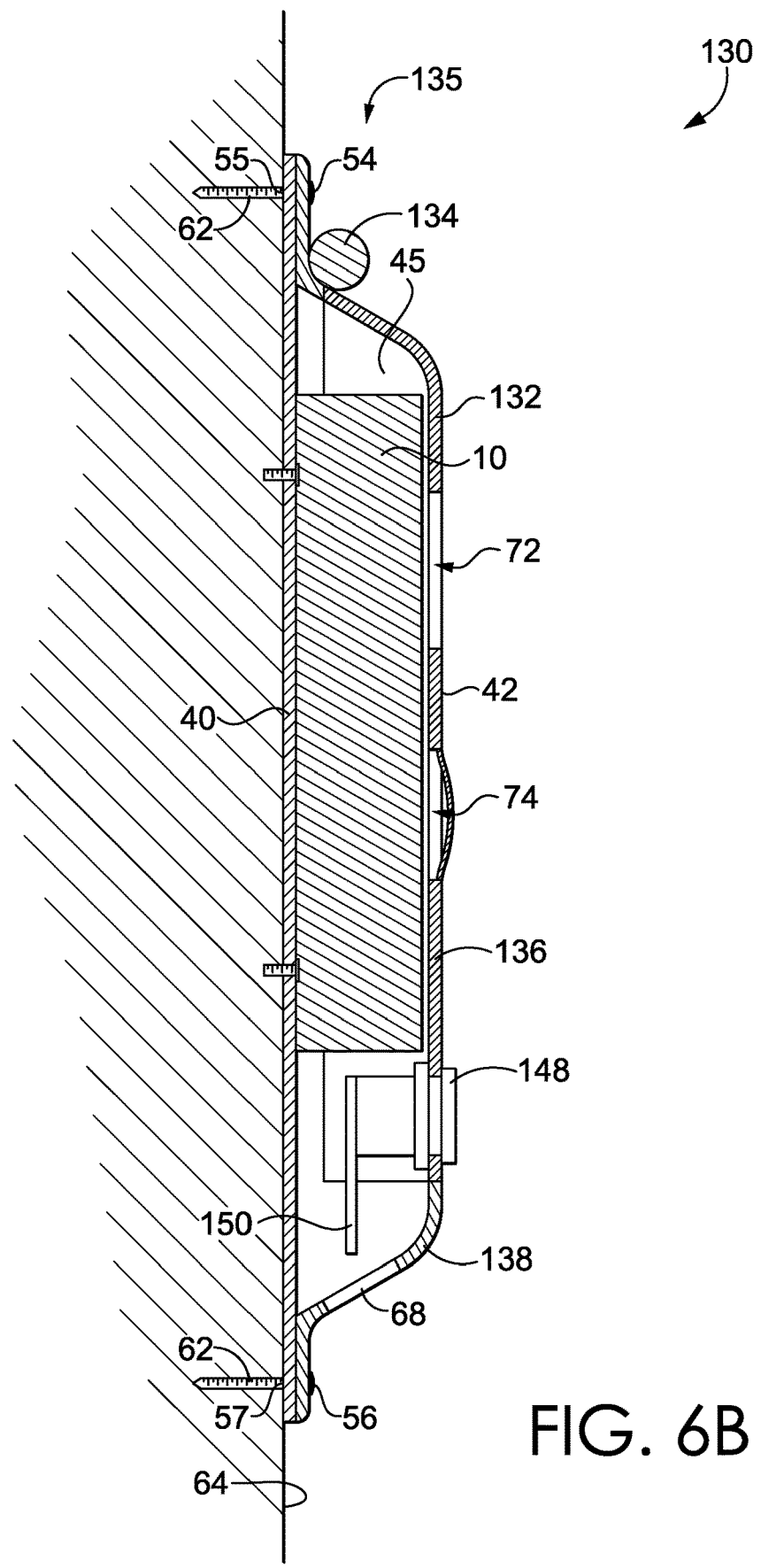
Figure 6C:
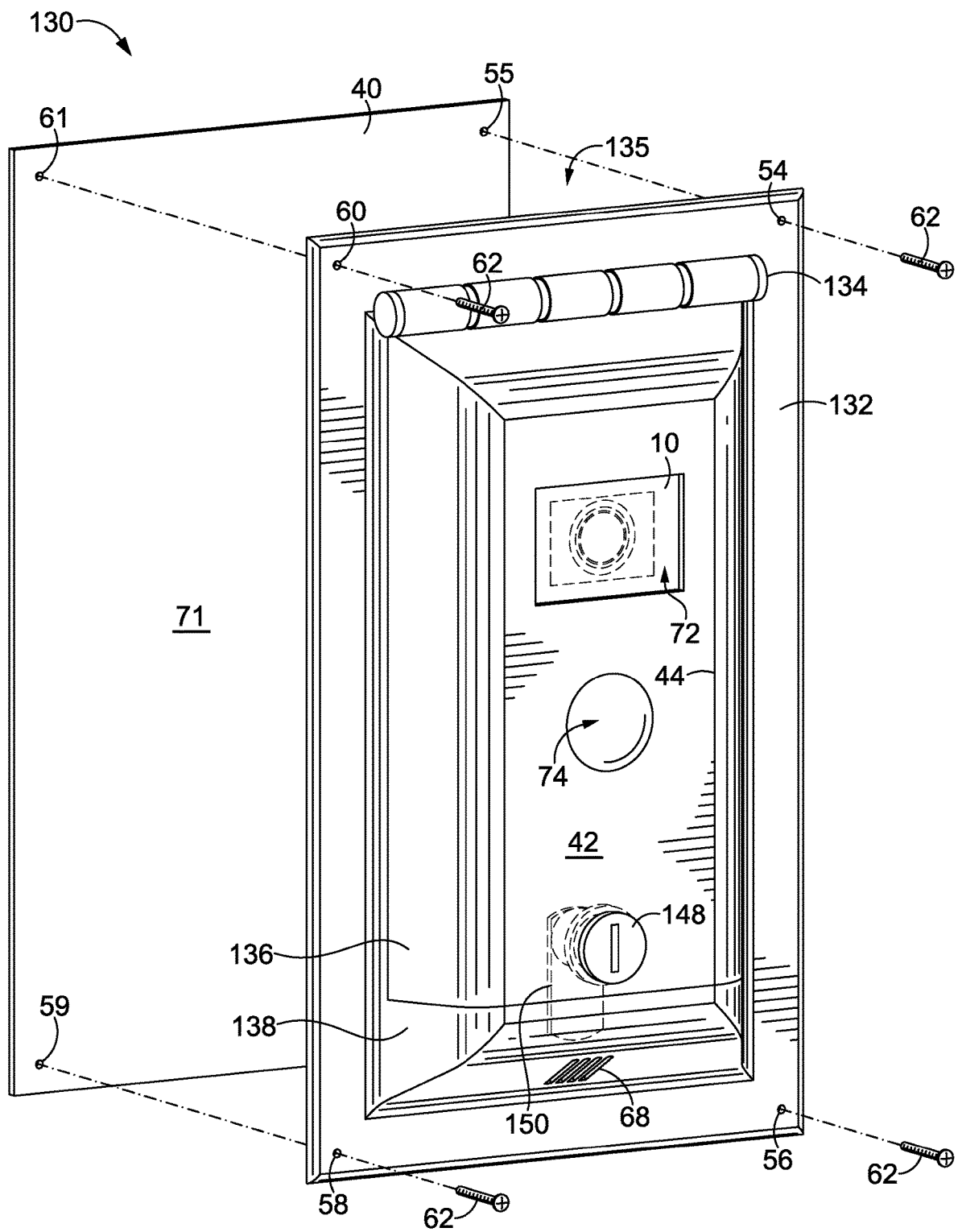

Referring now to FIGS. 6A-6C, a security cover 130 is depicted that includes movable components that can be used to gain access to an A/V recording and communication device enclosed within the security cover 130, according to various aspects of the present disclosure. FIG. 6A depicts a front elevational view of the security cover 130. FIG. 6B depicts a side elevational, cross-section view of the security cover 130 attached to the support surface 64. FIG. 6C depicts an exploded, perspective view of the security cover 130 showing the movable components thereof.

In general, the security cover 130 depicted in FIGS. 6A-6C includes a number of components, or features, that may be similar to the security cover 36 shown in FIGS. 3A-3C. The security cover 130 shown in FIGS. 6A-6C includes, like the security cover 36 described in connection with FIGS. 3A-3C, the rigid mounting plate 40, the front wall 42 which defines the front wall perimeter 44, the aperture 72 and the aperture 74 formed in the front wall 42, the fastener apertures 54, 56, 58, 60 formed in the rigid covering 132, and the fastener apertures 55, 57, 59, 61 formed in the rigid mounting plate 40 that are respectively alignable with the fastener apertures 54, 56, 58, 60 to form respective fastener passageways for receiving the elongated fasteners 62 used to secure the security cover 130 to the support surface 64.

Further shown in FIGS. 6A-6C, and in particular in FIG. 6C, which depicts an exploded view of the security cover 130, is the multi-part construction of the rigid covering 132. The rigid covering 38 of the security cover 36 shown in FIGS. 3A-3C may be formed of a single piece (e.g., from injection-molded plastic), or from a collection of pieces securely attached to each other. In contrast, the rigid covering 132 of the security cover 130 shown in FIGS. 6A-6C is formed from a multi-part construction, or rather, from separate components that are attached together in movable fashion. Because some A/V recording and communication devices, such as battery-powered doorbells for example, may require occasional or regular access for the purposes of maintenance (e.g., replacing/recharging batteries, resetting the device, changing components, etc.) or other reasons, having movable components incorporated into the security cover may be beneficial for an owner/user of the device. Such embodiments of the security cover may use securement or locking mechanisms that maintain the protective nature of the security cover during use, as discussed further below.

In particular, the rigid covering 132 of the security cover 130 may include a hinge 134 that movably couples one portion 136 of the rigid covering 132 to another portion 138 of the rigid covering 132. The portions 136, 138 of the rigid covering 132 are rotatable relative to each other about the hinge 134, which provides selective accessibility to an interior compartment of the security cover 130 when the security cover 130 is mounted on a support surface. In the embodiment shown in FIGS. 6A-6C, the hinge 134 is positioned toward a top end 135 of the security cover 130 (e.g., the end oriented upward when the security cover 130 and enclosed device 10 are mounted to the support surface 64).

Figure 7A:
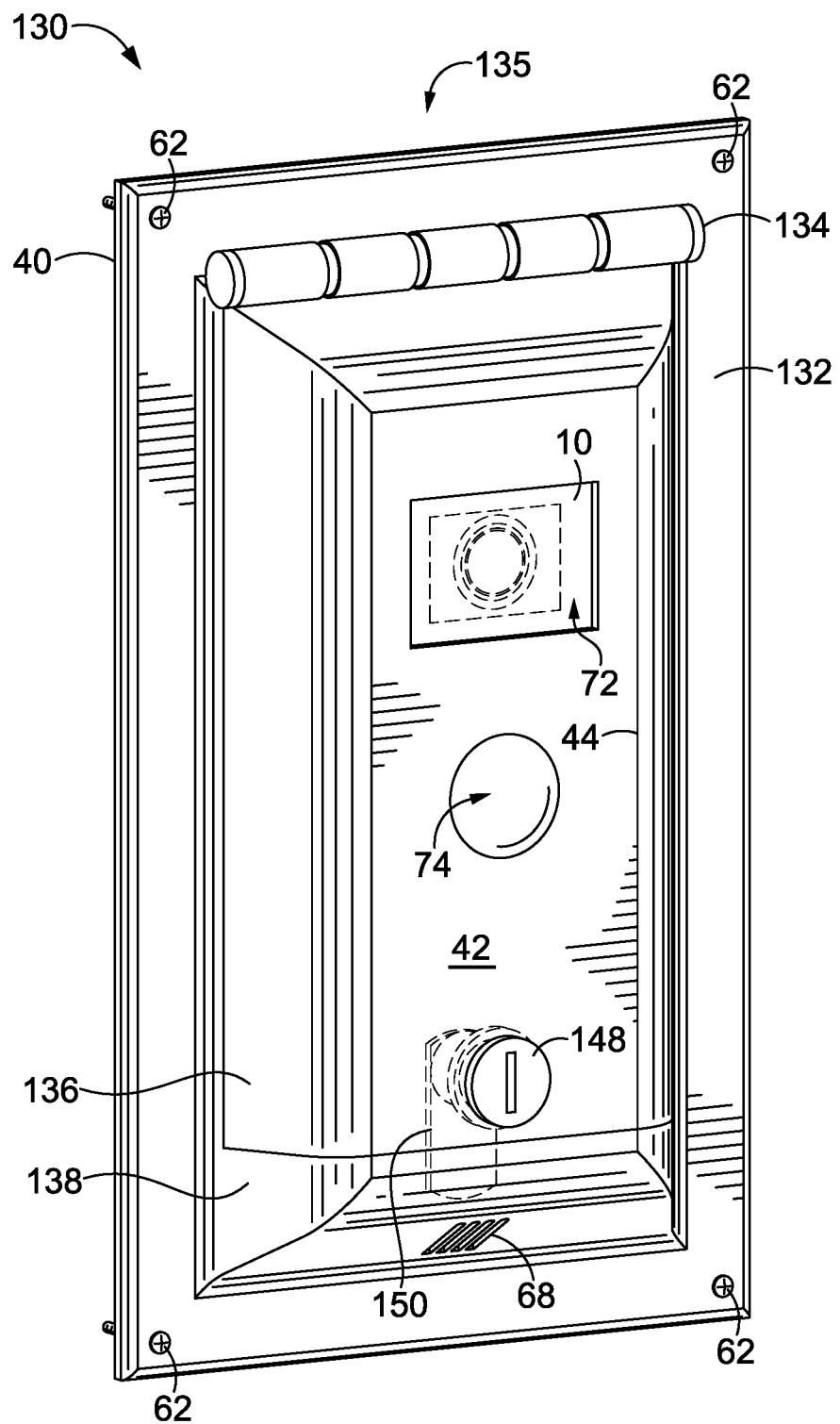
FIGS. 7A-7B are front perspective views of the security cover shown in FIGS. 6A-6C with portions of the security cover moved between different positions to provide access to the A/V recording and communication device enclosed therein, according to various aspects of the present disclosure.
Figure 7B:
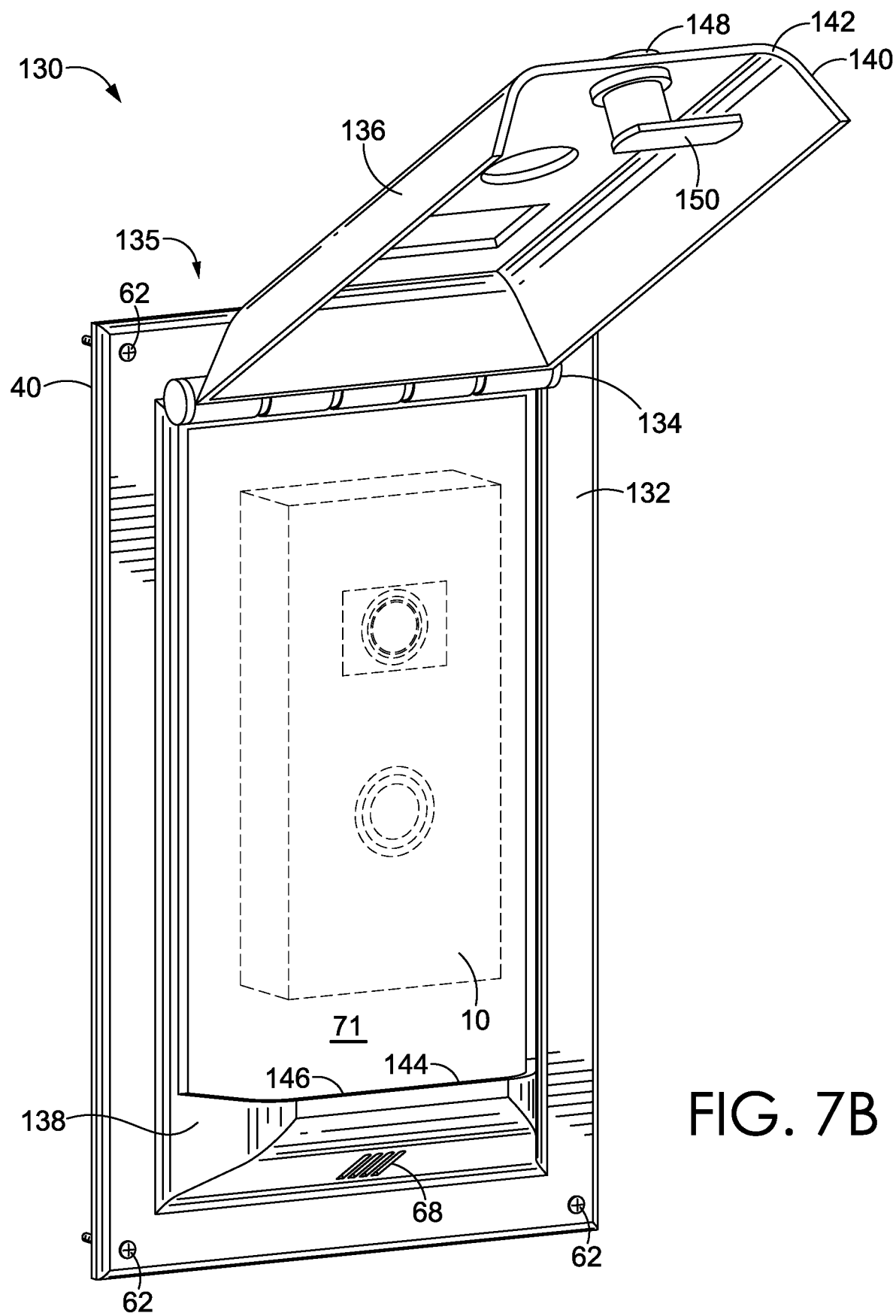

Further, with reference to FIG. 6B, when the security cover 130 is mounted, the portion 138 of the rigid covering 132 remains fixed to the support surface 64, and the portion 136 of the rigid covering 132 remains movable between a first position (depicted in FIGS. 6A-6B), in which a part 142 of a perimeter edge 140 of the portion 136 is adjacent (e.g., within approximately 1 centimeter) and/or is abutting a part 144 of a perimeter edge 146 of the portion 138 of the rigid covering 132, forming a more enclosed configuration of the security cover 130 about the doorbell 10, and a second position, at which the part 142 of the perimeter edge 140 of the portion 136 of the rigid covering 132 is spaced from the part 144 of the perimeter edge 146 of the portion 138 of the rigid covering 132 more than in the first position, forming a less enclosed configuration of the security cover 130, relatively speaking, that increases accessibility to the doorbell 10. In another sense, the first position and the second position may be considered a closed and open configuration, respectively, in terms of accessibility. Example first and second positions of the security cover 130 are shown in FIGS. 7A-7B below.

In the example embodiment depicted in FIGS. 6A-6C, the portion 136 of the rigid covering 132 includes contours that generally form a concave shape, which at least partially encloses and surrounds the doorbell 10 when the portion 136 of the rigid covering 132 is in the first position. The portions 136, 138 of the rigid covering 132 may be configured differently in different embodiments. For example, in other embodiments, the portions 136, 138 may be different relative sizes, and/or the portion 136 may comprise a different part or section of the overall rigid covering 132 (e.g., being larger, smaller, a different shape, more or fewer sloped or angled contours, at a different location, etc.). As one non-limiting example, the portion 136 of the rigid covering 132 may comprise a surface area that is approximately 50%-60%, 60%-70%, 70%-80%, 80%-90%, or 90-95% of the total surface area of the rigid covering 132 relative to the portion 138 of the rigid covering 132, in different embodiments. The portion 136 may also be a same or a different material as the portion 138. Additional hinges or other movement-enabling connections or components may also be used in different embodiments.

Further depicted in the example embodiment shown in FIGS. 6A-6C is a locking device 148. The locking device 148 shown in FIGS. 6A-6C is a rotatable key lock that drives a flange 150, and is adjustable between an engaged position (shown in FIGS. 6A-6B) and a disengaged position (shown in FIG. 7B). The locking device 148, when engaged, can secure the portion 136 of the rigid covering 132 in the first position by moving the flange 150 into a path of contact with the portion 138 of the rigid covering 132, as shown in FIGS. 6A-6B. When engaged in this fashion, the locking device 148, and the rotatable flange 150, restricts movement of the portion 136 of the rigid covering 132 from the first position to the second position, reducing access to an interior compartment 45 of the mounted security cover 130. The locking device 148 is further operable to move from the engaged position to the disengaged position in which the flange 150 is moved out of the path of contact with the portion 138 of the rigid covering (as shown in FIG. 7B), allowing the portion 136 of the rigid covering 132 to move from the first position to the second position (shown in FIG. 7B) with reduced restriction to provide increased access to an interior compartment 45 of the mounted security cover 130.

Although a key lock with a rotatable flange 150 is depicted and described as being the locking device 148 for the embodiment depicted in FIGS. 6A-6C, in alternative embodiments, other types of locking devices are contemplated. For example, the locking device may be any mechanism that moves engaging elements between different positions to provide a locked position and an unlocked position, using any type of moving element(s). Therefore, different types of locking devices and mechanisms are contemplated as within the scope of the present disclosure.

Referring now to FIGS. 7A-7B, the security cover 130 of FIGS. 6A-6C with the portion 136 of the rigid covering 132 moved to different positions is shown, according to various aspects of the present disclosure. FIG. 7A shows the security cover 130 with the portion 136 of the rigid covering 132 in the first position, such that the security cover 130 is in a more enclosed and secured configuration. FIG. 7B shows the portion 136 of the rigid covering 132 in the second position, or rather in a more open and accessible configuration that provides increased access to the doorbell 10 (or to another enclosed A/V recording and communication device in a different embodiment). The portion 136 of the rigid covering 132 is shown rotating about the hinge 134. The locking device 148 is shown in the engaged position in FIG. 7A, with the rotatable flange 150 moved into a position that allows it to contact the portion 138 of the rigid covering 132 when the portion 136 is moved outward. This positioning of the locking device 148 therefore restricts movement of the portion 136 of the rigid covering 132 toward the opened configuration from the closed configuration. The locking device 148 is shown in the disengaged position in FIG. 7B, with the rotatable flange 150 moved into a position that does not result in it contacting the portion 138 of the rigid covering 132 when the portion 136 is moved outward. This configuration results in less restriction of movement for the portion 136 of the rigid covering 132 between the closed configuration and the open configuration, relatively speaking.

Figure 8:
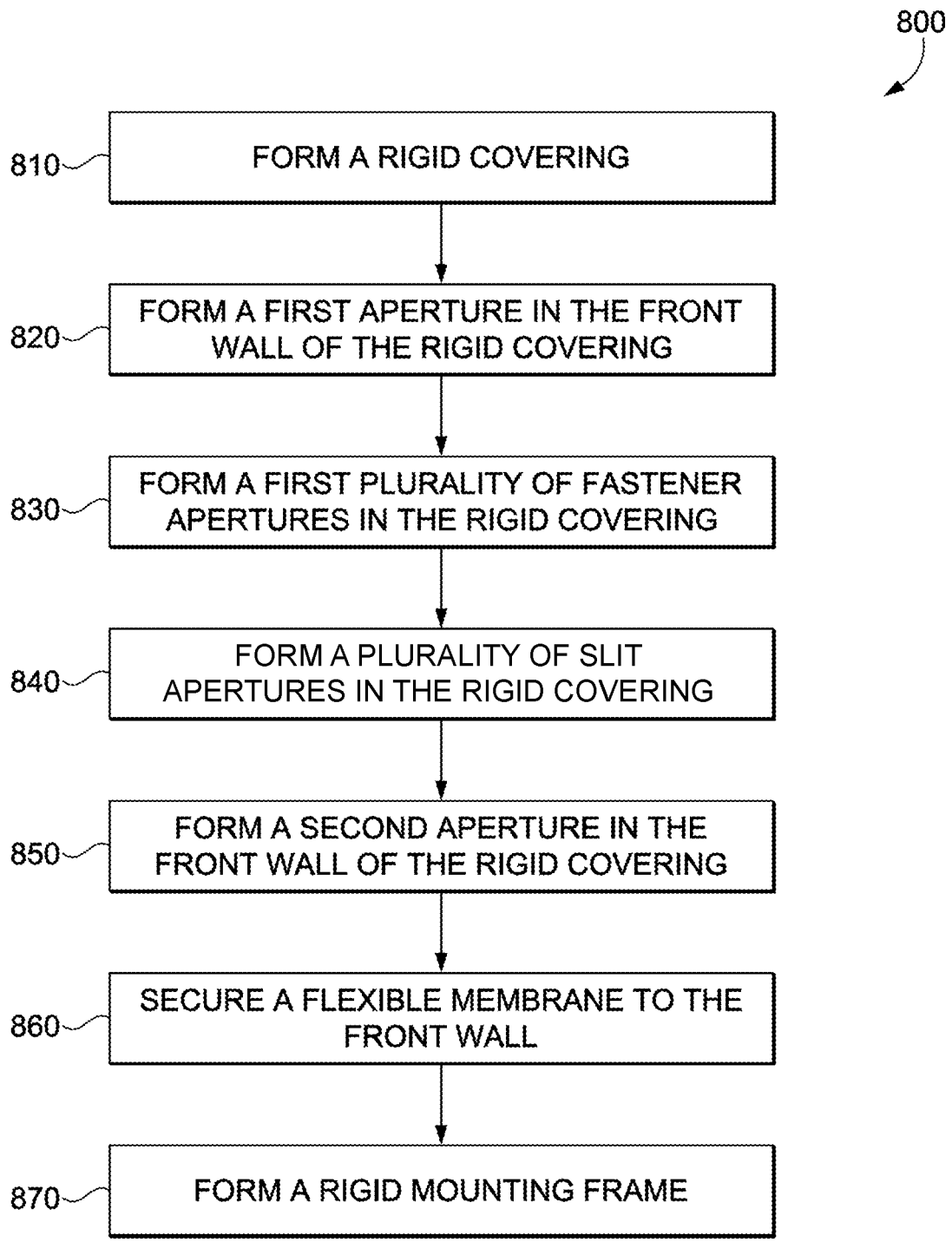
FIG. 8 is a flowchart illustrating an example method for manufacturing a security cover for an A/V recording and communication device, according to various aspects of the present disclosure.

Referring to FIG. 8, a flowchart of an example method/process 800 for manufacturing a security cover, such as the security cover 36 shown in FIGS. 3A-3C, for an audio/video (A/V) recording and communication device is provided, according to various aspects of the present disclosure. At block 810, a rigid covering, such as the rigid covering 38 shown in FIGS. 3A-3C, is formed. In embodiments, the rigid covering may be formed such that it can at least partially cover and/or enclose an A/V recording and communication device (e.g., the doorbell 10 described herein). The rigid covering may be formed from one or more materials, and also may be formed as one unified piece or as multiple pieces that are attached and/or assembled. For example, the rigid covering may be formed from injection molded plastic, or from Plexiglass. The rigid covering may alternatively be formed from metal, or a composite material (e.g., metal, plastic, and/or carbon fiber). The rigid covering may further be formed to have one or more apertures or slits. The rigid covering may include a front wall, such as the front wall 42 shown in FIGS. 3A-3C, having a front wall perimeter, such as the front wall perimeter 44 shown in FIGS. 3A-3C, a plurality of adjoining sidewalls, such as the sidewalls 46, 48, 50, 52 shown in FIG. 3A, extending from the front wall perimeter and sloped outward from the front wall, and a mounting surface, such as the mounting surface 70 shown in FIG. 3B, that extends about a distal end of the sidewalls.

At block 820, a first aperture, such as the aperture 72 shown in FIG. 3A, is formed in the rigid covering. The aperture may be formed to at least partially expose a camera, such as the camera 26 shown in FIG. 1, of an A/V recording and communication device, such as the A/V recording and communication doorbell 10 shown in FIG. 1, enclosed by the security cover. As discussed above, in different embodiments, the first aperture or any other aperture in the rigid covering may be formed concurrently with the formation of the rigid covering (e.g., during injection molding) or separately from the formation of the rigid covering, such as through cutting, drilling, or otherwise removing material from the rigid covering after it is initially formed.

At block 830, a first plurality of fastener apertures, such as the fastener apertures 54, 56, 58, 60 shown in FIGS. 3A-3B, are formed in the rigid covering. The first plurality of fastener apertures may be any number of apertures, and may be located at any location on the rigid covering such as, for example, adjacent to corners of the rigid covering and/or adjacent to side edges of the rigid covering (e.g., within approximately 2 centimeters of the perimeter edge and/or spaced at least 1-6 centimeters from each other).

At block 840, a plurality of slit apertures, such as the slit apertures 68 shown in FIG. 3A, are formed in the rigid covering to allow passage of sound from a speaker of the A/V recording and communication device and/or to allow passage of sound to a microphone of the A/V recording and communication device. The plurality of slit apertures may be located on the rigid covering based on a location of a microphone, such as the microphone of the doorbell 10 shown in FIG. 1, and/or a location of a speaker, such as the speaker of the doorbell 10 shown in FIG. 1, on a corresponding A/V recording and communication device with which the security cover is to be used. Additionally, in some embodiments, only one slit may be formed, and in other embodiments, the slit(s) may be at least partially covered (e.g., by a membrane or waterproof material) that provides further protection (e.g., from water, tampering, etc.). Any number of slits may be formed at one or multiple locations on a security cover, or none may be included, as discussed herein.

At block 850, a second aperture, such as the aperture 74 shown in FIG. 3A, is formed in the front wall of the rigid covering. The second aperture may be positioned to at least partially correspond to the location of a button on an A/V recording and communication device with which the security cover is used, allowing for interaction with the button through the second aperture. In other embodiments, a security cover may have no apertures, one aperture, or multiple apertures positioned at appropriate locations based on the design of the A/V recording and communication device. For example, the security cover may include one aperture generally located to facilitate physical interaction with one button, or two apertures that separately facilitate interaction with separate buttons, or other similar configurations. In this sense, the aperture(s) may be included and positioned so that a desired physical interaction with elements of the A/V recording and communication device can be achieved. For example, when using such apertures, openings, and/or exposures, a user may be able to press a button, or use a fingerprint scanner. The apertures, openings, and/or exposures may further support the function of certain elements, such as a camera, a microphone, a light, a sensor (e.g., an infrared sensor, motion sensor, temperature sensor, etc.). For example, separate apertures may be formed in a front wall of the rigid covering for a camera and motion sensor, or a common aperture may be provided to at least partially expose both a camera and a motion sensor, and/or another component of an enclosed A/V recording and communication device.

At block 860, a flexible membrane, such as the flexible membrane 75 shown in FIG. 3B, is secured over the front wall of the rigid covering. The securing of the flexible membrane to the front wall may result in the flexible membrane extending across an aperture of the front wall, such as, for example, the second aperture referenced at block 850. The flexible membrane may be any flexible material, such as silicone, rubber, or another flexible material. Further, when secured over the second aperture, the flexible membrane may be movable relative to the front wall, allowing engagement and/or interaction with an element of the A/V recording and communication device, such as a button, while still at least partially covering and/or protecting the A/V device (e.g., providing at least some protection from water and/or other elements).

At block 870, a rigid mounting frame, such as the rigid mounting plate 40 shown in FIGS. 3A-3C, is formed. The rigid mounting frame may be metal, plastic, a composite material, or any other material, or any combination of the same, and may be formed as one piece or may be assembled from multiple pieces. For example, the rigid mounting frame may be metal, and may include at least one planar surface. The rigid mounting frame may also include an interior aperture that can be sized to allow a perimeter of an A/V recording and communication device to be enclosed therein. Further, in some embodiments, the rigid mounting frame may include fastener apertures that are at least partially alignable with corresponding fastener apertures formed in the rigid covering to provide a corresponding number of fastener passageways through which individual fastening elements (e.g., screws, nails, expansion bolts, or other elongated attachment pieces) may be inserted to secure the rigid covering and the rigid mounting frame to a support surface. Alternatively, the rigid mounting frame may include no apertures and/or may be secured to a support surface with another attachment mechanism, such as adhesive, welding, male-female mounting attachments, or other attachment mechanisms.

The specific operations of the process 800 may not be performed in the exact order shown and described. Furthermore, the specific operations described with reference to FIG. 8 may not be performed in one continuous series of operations, in some aspects of the present disclosure, and different specific operations may be performed in different embodiments. For instance, in some aspects of the present embodiments, the process 800 may not form a plurality of slit apertures in the rigid covering. In these embodiments, the process 800 may not perform block 840. For example, some aspects of the security cover may not include slit apertures if there is no microphone or speaker on the A/V recording and communication device. Other aspects of the security cover may not include slit apertures even when the A/V recording and communication device includes microphone(s) and/or speaker(s).

In addition, in some of the present embodiments, the A/V recording and communication device's camera 26 (FIG. 1) and the button 16 may be in close proximity of each other. In some of these embodiments, the process 800 may form one aperture in the front wall of the rigid covering to at least partially expose the camera 26 and the button 16 of the A/V recording and communication device. In these embodiments, blocks 820 and 850 are combined together. Furthermore, in some of the present embodiments, the process 800 may not form a flexible membrane to the front wall. For example, in some embodiments, the button 16 (FIG. 1) of the A/V recording and communication device 10 may be exposed through the aperture 74 (FIGS. 3A-3C) of the security cover 36 or the aperture 74 (FIGS. 6A-6C, and 7A) of the security cover 130 without a flexible membrane covering the aperture 74. In these embodiments, the process 800 may not perform block 860.

Further, in some embodiments, the rigid covering 38 may be formed (at block 810) of a transparent material and may extend over the location of the camera aperture or lens, such that pictures and/or video is/are recorded looking through the rigid covering 38. Some of these embodiments may not include the aperture 72. In these embodiments, the process 800 may not perform block 820.

In other aspects of the security covers described herein, a portion of a security cover (e.g., a portion of a rigid covering thereof) may be removable, such as through disengagement of a locking device, allowing the portion to be taken off of the security cover. Such a selectively operable access opening may be provided to allow a user/owner of an A/V recording and communication device to remove the portion when needed to access the device for repair, maintenance, or replacement/recharging of batteries, for example.

As described above, the present embodiments, including those described in connection with FIGS. 1-8 and the method 800, advantageously provide a user/owner of an A/V recording and communication device, such as the doorbell 10 shown in FIGS. 1-2, with increased protection for the A/V recording and communication device and the components thereof from unwanted tampering, manipulation, and theft using a protective enclosure as described herein. One such protective enclosure may be, for example, the security cover 36 shown in FIGS. 3A-3C, or the security cover 130 shown in FIGS. 6A-6C, in addition to other embodiments and variations in accordance with the present disclosure. A security cover may be mounted over an existing, or complimentary, A/V recording and communication device to provide, for a user/owner, a protective enclosure that increases the difficulty of tampering with or stealing the device. The A/V device may therefore be more likely to remain mounted in position and within the control of the owner/user, which can allow for greater monitoring and surveillance of surrounding environments and neighborhoods, increasing safety and reducing crime.

The security covers described herein, in certain embodiments, may be adapted to allow for desired functionality of, and interaction with, an enclosed A/V recording and communication device and components thereof. For example, operability of a button of the device, such as the button 16 of the doorbell 10 shown in FIGS. 1-2, and/or operability of a microphone of the device, such as the microphone discussed in connection with the doorbell 10 shown in FIGS. 1-2, which can receive sound through the slit apertures 68 discussed in connection with the security cover 36 shown in FIGS. 3A-3C, can be maintained. Further, at least a portion of the security cover may be adjustable, movable, or removable, allowing for interaction with the enclosed A/V recording and communication device and components thereof. In this sense, the utility-based/functional aspects of an enclosed A/V recording and communication device may be at least partially preserved with the security covers described herein, while providing increased protection of the device from theft and tampering.

The present embodiments, such as, for example, the security cover 36 shown in FIGS. 3A-3C, may advantageously be used to protect A/V recording and communication devices, including their sophisticated and costly technical components such as cameras, microphones, computer processors, communication hardware, batteries, and/or other components that enable the audio and/or video monitoring and communication functionality of such devices, from theft and/or tampering. As a result of positioning A/V recording and communication devices outside of homes and buildings, the devices have increased exposure to manipulation, such as theft and tampering, and therefore the security covers disclosed herein may be used for additional protection of the A/V devices, while preserving functionality of the devices, and in some embodiments, providing selective accessibility for a user/owner.

As used herein, the term "A/V recording and communication device" is intended to encompass any type of device used for audio and/or video recording, monitoring, and/or communication of the same, including the components and/or assemblies of components of such devices. For example, in one non-limiting aspect, the A/V recording and communication device is a doorbell, such as the RING® RVD, RVD 2, or RVD Pro doorbells. A/V recording and communication devices may include various function-enabling technological components, such as microphone(s) for recording sound, camera(s) for recording video, motion sensor(s) for detecting movement, microprocessor(s), computer-readable media(s), and memory for executing applications and storing or accessing data, as well as other wireless or wired network communication components. The A/V recording and communication devices may also include sensors, lights, night-vision components, optical components (e.g., lenses), and/or other components or features, which are contemplated herein and which may be taken into consideration when configuring a security cover, so as to reduce interference with the functionality of such components. Security covers described herein may apply to devices that do not necessarily include audio functionality.

In some embodiments, this disclosure may include the language, for example, "at least one of [element A] and [element B]." This language may refer to one or more of the elements. For example, "at least one of A and B" may refer to "A," "B," or "A and B." In other words, "at least one of A and B" may refer to "at least one of A and at least one of B," or "at least either of A or B." In some embodiments, this disclosure may include the language, for example, "[element A], [element B], and/or [element C]." This language may refer to either of the elements or any combination thereof. In other words, "A, B, and/or C" may refer to "A," "B," "C," "A and B," "A and C," "B and C," or "A, B, and C."

In a first aspect, a security cover for an audio/video recording and communication device (A/V device comprises: a front wall including a camera aperture positioned to expose a camera of the A/V device; a plurality of adjoining sidewalls extending from the front wall and being sloped outward from the front wall; a mounting surface extending about the plurality of sidewalls, the mounting surface being spaced from the front wall and including a first plurality of fastener apertures; at least one sound aperture for allowing passage of sound from a speaker of the A/V device; a flexible membrane coupled to the front wall and movable relative to the front wall for actuating a button of the A/V device; and a rigid mounting frame having a second plurality of fastener apertures that are alignable with the first plurality of fastener apertures to form a plurality of fastener passageways adapted to receive a plurality of elongated fasteners configured to attach the security cover to a support surface.

In an embodiment of the first aspect, when the mounting surface and the rigid mounting frame are secured together the first plurality of fastener apertures and the second plurality of fastener apertures are at least partially aligned.

In another embodiment of the first aspect, the rigid mounting frame is sized such that the rigid mounting frame covers the mounting surface when the mounting surface and the rigid mounting frame are secured together.

In another embodiment of the first aspect, the front wall includes a sensor aperture positioned to expose an infrared sensor or a motion sensor of the A/V device.

In another embodiment of the first aspect, the rigid mounting frame comprises an interior opening having an interior perimeter that is equal to or larger than a perimeter of the A/V device, such that, when the security cover is mounted over the A/V device and to the support surface, the A/V device is mountable to the support surface within the interior perimeter of the interior opening.

An embodiment of the first aspect further comprises at least one hinge that rotatably couples a first portion of the security cover to a second portion of the security cover.

In another embodiment of the first aspect, when the security cover is mounted to the support surface, the first portion is movable between a first position and a second position, the second position providing increased access to an interior compartment of the mounted security cover that is configured to enclose the A/V device.

Another embodiment of the first aspect further comprises a locking device coupled to at least one of the first portion and the second portion, the locking device comprising a locking element that is movable between an engaged position and a disengaged position, the engaged position restricting movement of the first portion from the first position, and the disengaged position allowing movement of the first portion from the first position to the second position.

In another embodiment of the first aspect, a perimeter of the plurality of sidewalls comprises a curved contour that extends to an outer edge of the planar mounting surface.

In a second aspect, a security cover for an audio/video recording and communication device (A/V device) comprises: a front wall including first and second apertures, the first aperture positioned to expose a camera of the A/V device, the second aperture positioned to expose a button of the A/V device; a set of one or more adjoining sidewalls extending from the front wall and being sloped outward from the front wall; a mounting surface extending about the set of sidewalls, the mounting surface being spaced from the front wall; and a rigid mounting frame having a first surface for abutting a support surface and a second surface, opposite the first surface, for abutting the mounting surface, wherein the front wall, the set of sidewalls, and the rigid mounting frame together form an interior compartment to contain the A/V device.

An embodiment of the second aspect further comprises at least one sound aperture for allowing passage of sound from a speaker of the A/V device.

In an embodiment of the second aspect, the front wall includes a sensor aperture positioned to expose an infrared sensor or a motion sensor of the A/V device.

Another embodiment of the second aspect further comprises at least one hinge that movably couples a first portion of the security cover to a second portion of the security cover.

In another embodiment of the second aspect, the first portion is movable between a first position and a second position about the at least one hinge, the second position providing increased access to the interior compartment of the security cover.

In another embodiment of the second aspect, the first portion comprises the front wall and at least a portion of the set of sidewalls, and wherein the first portion comprises a concave shape.

Another embodiment of the second aspect further comprises a locking device coupled to at least one of the first portion and the second portion, the locking device comprising a locking element that is movable between an engaged position and a disengaged position, the engaged position restricting movement of the first portion from the first position, and the disengaged position allowing movement of the first portion from the first position to the second position.

In another embodiment of the second aspect, the locking device comprises a rotatable flange that engages the second portion of the rigid covering when the locking device is in the engaged position and the first portion is in the first position.

In another embodiment of the second aspect, the front wall and the set of sidewalls comprise a plastic that is at least partially transparent.

In another embodiment of the second aspect, the rigid mounting frame comprises at least one of plastic, metal, and carbon fiber.

In another embodiment of the second aspect, each of the sidewalls is joined to the front wall at a respective junction that is curved on both sides.

In a third aspect, a security cover for an audio/video (A/V) recording and communication doorbell comprises: a rigid covering for the A/V recording and communication doorbell, the rigid covering comprising: a front wall defining a front wall perimeter, the front wall including a first aperture positioned to expose a camera of the A/V recording and communication doorbell, a plurality of adjoining sidewalls extending from the front wall perimeter, the plurality of sidewalls sloped outward from the front wall, a planar mounting surface extending about distal edges of the plurality of sidewalls, the planar mounting surface being spaced from the front wall and including a first plurality of fastener apertures that extend through the rigid covering, and a plurality of slit apertures extending through the rigid covering for allowing passage of sound from a speaker of the A/V recording and communication doorbell and to a microphone of the A/V recording and communication doorbell; a flexible membrane coupled to the front wall and extending across a second aperture in the front wall, the flexible membrane movable relative to the front wall for actuating a button of the A/V recording and communication doorbell; a metal mounting frame having a second plurality of fastener apertures that are respectively alignable with the first plurality of fastener apertures to form a plurality of fastener passageways; and a plurality of elongated fasteners each extendable through a respective one of the plurality of fastener passageways for attaching the security cover to a support surface.

In an embodiment of the third aspect, the rigid covering and the metal mounting frame are secured to each other such that the first plurality of fastener apertures and the second plurality of fastener apertures are at least partially in alignment.

In another embodiment of the third aspect, the rigid covering comprises at least one of plastic, metal, and carbon fiber.

In another embodiment of the third aspect, the rigid covering comprises a concave portion shaped to mateably receive at least a portion of the metal mounting frame when the metal mounting frame and the rigid covering are coupled together to provide alignment of the first plurality of apertures and the second plurality of apertures.

In another embodiment of the third aspect, the front wall comprises a front wall first side and an opposite front wall second side, each one of the plurality of sidewalls comprises: a first sidewall portion, the first sidewall portion comprising a first sidewall portion first side and an opposite first sidewall portion second side, and a second sidewall portion extending from the first sidewall portion, the second sidewall portion comprising a second sidewall portion first side and an opposite second sidewall portion second side.

In another embodiment of the third aspect, the planar mounting surface comprises at least a portion of the second sidewall portion second side.

In another embodiment of the third aspect, each one of the plurality of sidewalls and the front wall are interconnected with a respective junction that is sloped such that an angle formed between the front wall second side and the first sidewall portion second side of any of the plurality of sidewalls is 90-150 degrees.

In another embodiment of the third aspect, the first sidewall portion and the second sidewall portion of each one of the plurality of sidewalls are interconnected with a respective junction that is sloped such that an angle formed between the first sidewall portion first side and the corresponding second sidewall portion first side of any of the plurality of sidewalls is 90-150 degrees.

In another embodiment of the third aspect, at least a portion of the rigid covering is movable to allow access to a battery of the A/V recording and communication device while the security cover is mounted to the support surface over the A/V recording and communication device.

In another embodiment of the third aspect, the at least a portion of the rigid covering is securable with a locking device.

An embodiment of the third aspect further comprises at least one hinge that movably couples a first portion of the rigid covering to a second portion of the rigid covering.

In another embodiment of the third aspect, when the security cover is mounted to the support surface, the first portion is movable between a first position and a second position about the at least one hinge, the second position providing increased access to an interior compartment of the mounted security cover.

In another embodiment of the third aspect, the first portion comprises the front wall and at least a portion of the plurality of sidewalls, and wherein the first portion comprises a concave shape.

Another embodiment of the third aspect further comprises a locking device coupled to the rigid covering, wherein the locking device is movable between an engaged position and a disengaged position to selectively allow and disallow access to an interior compartment of the mounted security cover.

In another embodiment of the third aspect, the locking device is a key lock with a rotatable flange that engages the second portion of the rigid covering when the locking device is in the engaged position and the first portion is in the first position.

In another embodiment of the third aspect, the engaged position of the locking device provides engagement of the locking device with at least one of the first portion and the second portion of the rigid covering when the first portion is in the first position, thereby restricting movement of the first portion of the rigid covering from the first position to the second position, and wherein the disengaged position allows the first portion of the rigid covering to move from the first position to the second position with reduced restriction relative to the engaged position.

In another embodiment of the third aspect, the locking device is coupled to the rigid covering adjacent an edge of the first portion that is opposite to the at least one hinge.

In another embodiment of the third aspect, the slit apertures are located adjacent an edge of the rigid covering.

In another embodiment of the third aspect, the metal mounting frame comprises an interior aperture having an interior perimeter that is equal to or larger than a perimeter of the A/V recording and communication doorbell.

In another embodiment of the third aspect, the elongated fasteners are threaded screws, each threaded screw being at least one inch in length.

In a fourth aspect, a method of forming a security cover for an audio/video (A/V) recording and communication device comprises: forming a rigid covering for the A/V recording and communication device, the rigid covering comprising: a front wall defining a front wall perimeter, a plurality of adjoining sidewalls extending from the front wall perimeter, the plurality of sidewalls sloped outward from the front wall, and a mounting surface extending about distal edges of the plurality of sidewalls, the mounting surface being spaced from the front wall, forming a first aperture in the front wall that is positioned to expose a camera of the A/V recording and communication device, forming a first plurality of fastener apertures in the rigid covering that extend through the rigid covering and the mounting surface; forming a plurality of slit apertures in the rigid covering, the plurality of slit apertures positioned to allow passage of sound from a speaker of the A/V recording and communication device; forming a second aperture in the front wall; securing a flexible membrane to the front wall such that the flexible membrane extends across the second aperture, the flexible membrane movable relative to the front wall for actuating a button of the A/V recording and communication device; and forming a rigid mounting frame, the rigid mounting frame having a second plurality of fastener apertures that are alignable with the first plurality of fastener apertures to form a plurality of fastener passageways.

In an embodiment of the fourth aspect, the A/V recording and communication device is an A/V recording and communication doorbell.

In another embodiment of the fourth aspect, the rigid covering comprises plastic that is at least partially transparent.

In another embodiment of the fourth aspect, the front wall comprises a front wall first side and an opposite front wall second side, and each one of the plurality of sidewalls comprises: a first sidewall portion comprising a first sidewall portion first side and an opposite first sidewall portion second side, and a second sidewall portion extending from the first sidewall portion and comprising a second sidewall portion first side and an opposite second sidewall portion second side.

In another embodiment of the fourth aspect, each one of the plurality of sidewalls and the front wall are joined at a respective junction that is sloped such that an angle formed between the front wall second side and the first sidewall portion second side of any of the plurality of sidewalls is 90-150 degrees.

In another embodiment of the fourth aspect, the first sidewall portion and the second sidewall portion of each of the plurality of sidewalls are joined at a respective junction that is sloped such that an angle formed between the first sidewall portion first side and the corresponding second sidewall portion first side of any of the plurality of sidewalls is 90-150 degrees.

In another embodiment of the fourth aspect, forming the rigid covering further comprises forming a first portion of the rigid covering, forming a second portion of the rigid covering, and coupling the first portion of the rigid covering to the second portion of the rigid covering with at least one hinge that rotatably couples the first portion and the second portion.

In another embodiment of the fourth aspect, the first portion is rotatable about the at least one hinge between a first position and a second position.

In another embodiment of the fourth aspect, the first position comprises abutting contact of an edge of the first portion and an edge of the second portion.

In another embodiment of the fourth aspect, the second position comprises the edge of the first portion and the edge of the second portion being spaced relative to each other.

In another embodiment of the fourth aspect, comprising coupling a locking device to the rigid covering, wherein the locking device is movable between an engaged position and a disengaged position.

In another embodiment of the fourth aspect, when the first portion is in the first position and the locking device is in the engaged position, the locking device restricts movement of the first portion from the first position to the second position, and wherein, when the first portion is in the first position and the locking device is in the disengaged position, the first portion of the rigid covering is able to move from the first position to the second position.

In another embodiment of the fourth aspect, a perimeter of the rigid covering comprises a curved portion that extends to an edge of the mounting surface.

The above description presents the best mode contemplated for carrying out the present embodiments, and of the manner and process of practicing them, in such full, clear, concise, and exact terms as to enable any person skilled in the art to which they pertain to practice these embodiments. The present embodiments are, however, susceptible to modifications and alternate constructions from those discussed above that are fully equivalent. Consequently, the present invention is not limited to the particular embodiments disclosed. On the contrary, the present invention covers all modifications and alternate constructions coming within the spirit and scope of the present disclosure. For example, the steps in the processes described herein need not be performed in the same order as they have been presented, and may be performed in any order(s). Further, steps that have been presented as being performed separately may in alternative embodiments be performed concurrently. Likewise, steps that have been presented as being performed concurrently may in alternative embodiments be performed separately.

What is claimed is:

1. A security cover for an audio/video recording and communication device (A/V device), the security cover comprising:
    a rigid covering comprising:
        a first aperture positioned to expose a camera of the A/V device;
        a second aperture positioned to expose a button of the A/V device; and
        a mounting surface comprising a first plurality of fastener apertures that extend through the rigid covering;
    a hinge that movably couples a first portion of the security cover to a second portion of the security cover, wherein the first portion is movable between a first position and a second position about the hinge, the second position providing access to a battery of the A/V device; and
    a rigid mounting frame having a first surface for abutting a support surface and a second surface, opposite the first surface, for abutting the mounting surface, wherein the rigid mounting frame comprises a second plurality of fastener apertures that are respectively alignable with the first plurality of fastener apertures to form a plurality of fastener passageways, wherein the rigid covering and the rigid mounting frame together form an interior compartment to contain the AN device.

2. The security cover of claim 1, further comprising a key lock coupled to at least one of the first portion and the second portion, the key lock comprising a flange that is movable between an engaged position and a disengaged position, the engaged position restricting movement of the first portion from the first position, and the disengaged position allowing movement of the first portion from the first position to the second position.

3. The security cover of claim 1, further comprising a plurality of elongated fasteners each extendable through a respective one of the plurality of fastener passageways for attaching the security cover to the support surface.

4. The security cover of claim 1, wherein the rigid covering comprises a concave portion shaped to receive at least a portion of the rigid mounting frame when the rigid mounting frame and the rigid covering are coupled together to provide alignment of the first plurality of apertures and the second plurality of apertures.

5. The security cover of claim 1, the rigid covering further comprising an aperture positioned to expose an infrared sensor or a motion sensor of the A/V device.

6. The security cover of claim 1, the rigid covering further comprising at least one sound aperture for allowing passage of sound from a speaker of the AN device.

7. The security cover of claim 1, wherein the first aperture is covered by a transparent material extending over an aperture of the camera of the A/V device.

8. A security cover for an audio/video recording and communication device (AN device), the security cover comprising:
    a rigid covering comprising:
        a first aperture positioned to expose a camera of the A/V device;
        a second aperture positioned to expose a button of the A/V device; and
        a mounting surface;
    a hinge that movably couples a first portion of the security cover to a second portion of the security cover, wherein the first portion is movable between a first position and a second position about the hinge, the second position providing increased access to an interior compartment of the security cover; and
    a rigid mounting frame having a first surface for abutting a support surface and a second surface, opposite the first surface, for abutting the mounting surface, wherein the rigid covering and the rigid mounting frame together form the interior compartment to contain the A/V device.

9. The security cover of claim 8, further comprising a locking device coupled to at least one of the first portion and the second portion, the locking device comprising a locking element that is movable between an engaged position and a disengaged position, the engaged position restricting movement of the first portion from the first position, and the disengaged position allowing movement of the first portion from the first position to the second position.

10. The security cover of claim 9,
    wherein, in the engaged position, the locking element moves into a path of contact with the second portion of the security cover, restricting the movement of the first portion from the first position, and
    wherein, in the disengaged position, the locking element moves out of the path of contact with the second portion of the security cover, allowing the movement of the first portion from the first position into the second position.

11. The security cover of claim 9, wherein the locking device comprises a rotatable flange that engages the second portion of the security cover when the locking device is in the engaged position and the first portion is in the first position.

12. The security cover of claim 8, the rigid covering further comprising at least one sound aperture for allowing passage of sound from a speaker of the A/V device.

13. The security cover of claim 8, the rigid covering further comprising an aperture positioned to expose an infrared sensor or a motion sensor of the A/V device.

14. The security cover of claim 8, wherein the rigid mounting frame comprises an interior opening having an interior perimeter that is equal to or larger than a perimeter of the A/V device, such that, when the security cover is mounted over the A/V device and to the support surface, the A/V device is mountable to the support surface within the interior perimeter of the interior opening.

15. The security cover of claim 8, wherein the rigid covering comprises a smooth contour facing outward when mounted on the support surface.

16. The security cover of claim 8, wherein a perimeter of the rigid covering comprises a curved contour that extends to an outer edge of the mounting surface.

17. The security cover of claim 8, wherein the mounting surface and the rigid mounting frame are secured together by one or more of a plurality of bolts, a plurality of male/female connectors, a plurality of fasteners, and adhesive material.

18. The security cover of claim 8, wherein the first aperture is covered by a transparent material extending over an aperture of the camera of the A/V device.

19. The security cover of claim 8, wherein the rigid covering at least partially comprises one or more of High Impact Polystyrene (HIPS), Polycarbonate (PC), Acrylonitrile Butadiene Styrene (ABS), carbon fiber, aluminum, steel, and Kevlar.

20. The security cover of claim 8, wherein the rigid covering at least partially comprises one of plastic, metal, metal alloy, wood, and carbon fiber, and wherein the rigid mounting frame at least partially comprises one of plastic, metal, metal alloy, wood, and carbon fiber.

\* \* \* \* \*